(12) United States Patent
Kawazoe et al.

(10) Patent No.: US 6,338,986 B1
(45) Date of Patent: Jan. 15, 2002

(54) ELECTROSTATIC DISCHARGE PROTECTION DEVICE FOR SEMICONDUCTOR INTEGRATED CIRCUIT METHOD FOR PRODUCING THE SAME AND ELECTROSTATIC DISCHARGE PROTECTION CIRCUIT USING THE SAME

(75) Inventors: Hidechika Kawazoe; Eiji Aoki, both of Nara-ken (JP); Sheng Teng Hsu, Camas, WA (US); Katsumasa Fujii, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/379,108

(22) Filed: Aug. 23, 1999

(30) Foreign Application Priority Data

Aug. 25, 1998 (JP) ............................. 10-239170
Aug. 17, 1999 (JP) ............................. 11-230955

(51) Int. Cl.⁷ ............................................. H01L 21/332
(52) U.S. Cl. ................... 438/133; 257/173; 257/355; 257/360; 257/362; 361/56; 361/111; 361/117; 361/118; 361/212
(58) Field of Search ..................... 361/212, 56, 111, 361/117, 118; 257/360, 355, 362, 173

(56) References Cited

U.S. PATENT DOCUMENTS

| | | | |
|---|---|---|---|
| 4,331,884 A | 5/1982 | Svedberg | 327/440 |
| 4,694,315 A | 9/1987 | Svedberg | 257/357 |
| 5,072,273 A | 12/1991 | Avery | 257/173 |
| 5,274,262 A | 12/1993 | Avery | 257/362 |
| 5,329,143 A * | 7/1994 | Chan et al. | 257/173 |
| 5,602,404 A | 2/1997 | Chen et al. | 257/112 |
| 5,708,550 A | 1/1998 | Avery | 257/173 |
| 5,804,861 A * | 9/1998 | Leach | 257/362 |
| 5,920,096 A * | 7/1999 | Lee | 257/355 |
| 5,959,332 A * | 9/1999 | Ravanelli et al. | 257/360 |
| 6,108,181 A * | 8/2000 | Gerosa | 361/56 |

FOREIGN PATENT DOCUMENTS

JP   2505652 B2   4/1996

* cited by examiner

Primary Examiner—Richard Elms
Assistant Examiner—Pho Luu
(74) Attorney, Agent, or Firm—Nixon & Vanderhye P.C.

(57) ABSTRACT

An electrostatic discharge protection device according to the present invention is provided at an input or an output of a semiconductor integrated circuit for protecting an internal circuit of the semiconductor integrated circuit from an electrostatic surge flowing into or out of the semiconductor integrated circuit. The electrostatic discharge protection device includes: a thyristor; and a trigger diode for triggering the thyristor with a low voltage. The trigger diode includes: an n-type cathode high impurity concentration region; a p-type anode high impurity concentration region; and an insulator section for electrically insulating a silicide layer formed on a surface of the n-type cathode high impurity concentration region from another silicide layer formed on a surface of the p-type anode high impurity concentration region.

12 Claims, 18 Drawing Sheets

ELECTROSTATIC DISCHARGE PROTECTION DEVICE FOR SEMICONDUCTOR INTEGRATED CIRCUIT METHOD FOR PRODUCING THE SAME AND ELECTROSTATIC DISCHARGE PROTECTION CIRCUIT USING THE SAME

BACKGROUND OF THE INVENTION

1. Field of the Invention

The present invention relates to an electrostatic discharge protection device used in a semiconductor integrated circuit for protecting the semiconductor integrated circuit from breaking due to an electrostatic charge flowing into or out of the circuit (electrostatic discharge phenomenon). The present invention also relates to a method for producing such an electrostatic discharge protection device, and an electrostatic discharge protection circuit using the same.

2. Description of the Related Art

The electrostatic discharge, as discussed in the field of semiconductor integrated circuits, is a phenomenon in which an electrostatic charge flows into a semiconductor integrated circuit from an electrostatically charged person or machine, or an electrostatic charge flows into an external conductor from a semiconductor integrated circuit which has been electrostatically charged by friction, etc. When the electrostatic discharge phenomenon occurs, an amount of electrostatic charge flows into or out of a semiconductor integrated circuit in a moment. Thus, an excessive current flows through the semiconductor integrated circuit device, whereby an excessive voltage flows through an internal circuit. Consequently, junction breakdown, line melting, oxide film dielectric breakdown, or the like, may occur, thereby breaking the semiconductor integrated circuit.

In order to prevent the semiconductor integrated circuit from breaking due to the electrostatic discharge phenomenon, an electrostatic discharge protection device is commonly provided between an external terminal and an internal circuit of a semiconductor integrated circuit so as to form a bypass circuit for static electricity. Such an electrostatic discharge protection device is provided during a step in the production of the semiconductor integrated circuit. In order not to increase the production cost of a semiconductor integrated circuit, it is desirable to provide the electrostatic discharge protection device without performing any additional step.

Commonly-employed electrostatic discharge protection devices include current limiting elements for limiting a transient current flowing in a semiconductor integrated circuit, such as a diffused resistor, and a polysilicon resistor. Other such protection circuits include a voltage clamping element for suppressing the voltage applied to an internal circuit, such as a diode, a thyristor, a MOS transistor, and a bipolar transistor.

A thyristor, as a current clamping element, can advantageously produce an excessive discharge current. However, a trigger voltage at which the thyristor is turned ON is generally high, e.g., about 25 V to about 40 V, whereby the semiconductor integrated circuit may break before the thyristor is activated. In view of this, thyristors have been adjusted to reduce the trigger voltage.

FIG. 24 is a cross-sectional view illustrating an exemplary conventional electrostatic discharge protection device, and more particularly, a thyristor that can be triggered by a low voltage (Japanese Patent No. 2505652).

Referring to FIG. 24, an n-type well 2 is provided in a p-type substrate 1 as an n-type impurity diffused layer. A p-type anode high impurity concentration region 4 and an n-type anode gate high impurity concentration region 5 are provided in the n-type well 2. A p-type high impurity concentration region 55 is provided across the boundary between the n-type well 2 and the p-type substrate 1, so that a portion of the p-type high impurity concentration region 55 is surrounded by the n-type well 2 and another portion thereof is surrounded by the p-type substrate 1. An n-type cathode high impurity concentration region 6 and a p-type cathode gate high impurity concentration region 7 are provided in another region of the p-type substrate 1 away from the n-type well 2. The p-type anode high impurity concentration region 4 and the n-type anode gate high impurity concentration region 5 are connected to an anode terminal 36 via a contact 16 and a metal 18. The n-type cathode high impurity concentration region 6 and the p-type cathode gate high impurity concentration region 7 are connected to a cathode terminal 54 via another contact 16 and another metal 53.

Referring to FIG. 25, the low voltage thyristor as illustrated in FIG. 24 may be provided between a power supply line 52 and a reference voltage line 45 of a semiconductor integrated circuit. An anode terminal 36 of the electrostatic discharge protection device 56 is connected to the power supply line 52, and the cathode terminal 54 of the electrostatic discharge protection device 56 is connected to the reference voltage line 45. An excessive voltage due to an electrostatic discharge is applied to the power supply line 52. When the electrostatic discharge reaches the trigger voltage of the thyristor provided in the electrostatic discharge protection device 56, the thyristor is turned ON, thereby forming a low-resistance path between the power supply line 52 and the reference voltage line 45. The low-resistance path bypasses an electrostatic charge flowing into the device from a power supply terminal 51 to a reference voltage terminal 44, thereby preventing breakdown of a semiconductor integrated circuit 57 connected to the power supply line 52 and the reference voltage line 45.

Where the p-type high impurity concentration region 55 is not provided, the trigger voltage of the thyristor is determined by the breakdown voltage between the p-type substrate 1 and the n-type well 2. With the production process of a common CMOS semiconductor integrated circuit, the trigger voltage will be as high as about 25 V to about 40 V. With such a high voltage, internal circuits of the semiconductor integrated circuit 57 will break down before the thyristor is turned ON. The trigger voltage of the thyristor illustrated in FIG. 24 is determined by the breakdown voltage between the p-type high impurity concentration region 55 and the n-type well 2. Due to the presence of the p-type high impurity concentration region 55, the breakdown voltage can be reduced below the breakdown voltage between the p-type substrate 1 and the n-type well 2.

Since the minimum process dimension of a semiconductor integrated circuit became minute, and a demand for a faster operation of an integrated circuit increased, a salicide (self-alignment silicide) step has been employed in order to reduce the source/drain diffused resistance or the gate line resistance of a MOS transistor. In the salicide step, a silicon substrate surface and a polysilicon surface, whose resistances are to be reduced, are first adjusted to be exposed, on which a high melting point metal such as titanium or cobalt is deposited. Then, a heat treatment is performed so as to provide an alloy (silicide) of silicon and the high melting point metal.

In the salicide step in the CMOS process, a silicide layer is provided on a portion of a silicon surface which is not covered with a gate oxide film or a device separation insulator of the MOS transistor. In the thyristor of FIG. 24, which can be triggered by a low voltage, the silicon surfaces of the p-type high impurity concentration region 55 (to be the trigger) and then-type well 2 are both covered with the silicide layer. Then, the p-type high impurity concentration region 55 and the n-type well 2 are shortcircuitted with each other, whereby breakdown can no longer occur therebetween. Due to the shortcircuit, the n-type anode gate high impurity concentration region 5, then-type well 2, the p-type high impurity concentration region 55, the p-type substrate 1, and the p-type cathode gate high impurity concentration region 7 are shortcircuitted with one another, whereby the anode terminal 36 and the cathode terminal 54 are shortcircuitted with each other.

A way of avoiding the shortcircuit between the p-type high impurity concentration region 55 and the n-type well 2 is to provide a silicidation inhibiting insulator on the silicon surface of the pn junction between the p-type high impurity concentration region 55 and the n-type well 2, in a step separate from the step of forming a semiconductor integrated circuit and prior to the salicide step. This method, however, adds a further step or photomask to the semiconductor integrated circuit process, thereby increasing the production cost of the semiconductor integrated circuit.

SUMMARY OF THE INVENTION

According to one aspect of this invention, an electrostatic discharge protection device is provided at an input or an output of a semiconductor integrated circuit for protecting an internal circuit of the semiconductor integrated circuit from an electrostatic surge flowing into or out of the semiconductor integrated circuit. The electrostatic discharge protection device includes: a thyristor; and a trigger diode for triggering the thyristor with a low voltage. The trigger diode includes: an n-type cathode high impurity concentration region; a p-type anode high impurity concentration region; and an insulator section for electrically insulating a silicide layer formed on a surface of the n-type cathode high impurity concentration region from another silicide layer formed on a surface of the p-type anode high impurity concentration region.

In one embodiment of the invention, the insulator section includes: a gate oxide film formed between the n-type cathode high impurity concentration region and the p-type anode high impurity concentration region for providing a gate of a MOS transistor of the semiconductor integrated circuit; a polysilicon patterned on the gate oxide film; and a gate sidewall insulator provided on a sidewall of the gate oxide film and a sidewall of the polysilicon for electrically insulating the silicide layer formed on the surface of the n-type cathode high impurity concentration region from the silicide layer formed on the surface of the p-type anode high impurity concentration region.

In one embodiment of the invention, the electrostatic discharge protection device is formed in a p-type semiconductor substrate. The n-type cathode high impurity concentration region is formed in an n-type well. A portion of the p-type anode high impurity concentration region is included in the n-type well. Another portion of the p-type anode high impurity concentration region is included in the p-type semiconductor substrate or a p-type well.

In one embodiment of the invention, the electrostatic discharge protection device is formed in a p-type semiconductor substrate. The p-type anode high impurity concentration region is formed in the p-type semiconductor substrate or a p-type well. A portion of the n-type cathode high impurity concentration region is included in an n-type well. Another portion of the n-type cathode high impurity concentration region is included in the p-type semiconductor substrate or the p-type well.

In one embodiment of the invention, the electrostatic discharge protection device is formed in an n-type semiconductor substrate. The n-type cathode high impurity concentration region is formed in the n-type semiconductor substrate. A portion of the p-type anode high impurity concentration region is included in a p-type well. Another portion of the p-type anode high impurity concentration region is included in the n-type semiconductor substrate or an n-type well.

In one embodiment of the invention, the electrostatic discharge protection device is formed in an n-type semiconductor substrate. The p-type anode high impurity concentration region is formed in a p-type well. A portion of the n-type cathode high impurity concentration region is included in the p-type well. Another portion of the n-type cathode high impurity concentration region is included in the n-type semiconductor substrate or an n-type well.

In one embodiment of the invention, the insulator section includes a device separation insulator which is formed between the n-type cathode high impurity concentration region and the p-type anode high impurity concentration region for providing a device separation region of a MOS transistor of the semiconductor integrated circuit.

In one embodiment of the invention, the electrostatic discharge protection device is formed in a p-type semiconductor substrate. The n-type cathode high impurity concentration region is formed in an n-type well. A portion of the p-type anode high impurity concentration region is included in the n-type well. Another portion of the p-type anode high impurity concentration region is included in the p-type semiconductor substrate or a p-type well.

In one embodiment of the invention, the electrostatic discharge protection device is formed in a p-type semiconductor substrate. The p-type anode high impurity concentration region is formed in the p-type semiconductor substrate or a p-type well. A portion of the n-type cathode high impurity concentration region is included in an n-type well. Another portion of the n-type cathode high impurity concentration region is included in the p-type semiconductor substrate or the p-type well.

In one embodiment of the invention, the electrostatic discharge protection device is formed in an n-type semiconductor substrate. The n-type cathode high impurity concentration region is formed in the n-type semiconductor substrate. A portion of the p-type anode high impurity concentration region is included in a p-type well. Another portion of the p-type anode high impurity concentration region is included in the n-type semiconductor substrate or an n-type well.

In one embodiment of the invention, the electrostatic discharge protection device is formed in an n-type semiconductor substrate. The p-type anode high impurity concentration region is formed in a p-type well. A portion of the n-type cathode high impurity concentration region is included in the p-type well. Another portion of the n-type cathode high impurity concentration region is included in the n-type semiconductor substrate or an n-type well.

According to another aspect of this invention, a method for producing an electrostatic discharge protection device of the present invention is provided. The method includes the steps of: forming an n-type cathode high impurity concentration region; forming a p-type anode high impurity concentration region; and forming an insulator section for electrically insulating a silicide layer formed on a surface of the n-type cathode high impurity concentration region from another silicide layer formed on a surface of the p-type anode high impurity concentration region.

In one embodiment of the invention, the step of forming the insulator section includes the steps of: forming, on a silicon substrate, a gate oxide film to be a gate of a MOS transistor of a semiconductor integrated circuit; patterning, on the gate oxide film, a polysilicon to be a gate electrode of the MOS transistor; implanting ions of a p-type impurity using the polysilicon and a p-type ion implantation resist as masks; implanting ions of an n-type impurity using the polysilicon and an n-type ion implantation resist as masks; forming a gate sidewall insulator on a sidewall of the polysilicon and a sidewall of the gate oxide film; and forming a silicide layer on a surface of the n-type cathode high impurity concentration region and a surface of the p-type anode high impurity concentration region.

In one embodiment of the invention, the method further includes, before the step of implanting ions of a p-type or n-type impurity, the step of: where the n-type cathode high impurity concentration region of the trigger diode of the thyristor forms a PN junction with a p-type substrate or a p-type well, arranging an edge of a p-type ion implantation photomask at a position in the polysilicon region which is shifted away from an edge of an n-type impurity implantation region.

In one embodiment of the invention, the method further includes, before the step of implanting ions of a p-type or n-type impurity, the step of: where the p-type cathode high impurity concentration region of the trigger diode of the thyristor forms a PN junction with an n-type substrate or an n-type well, arranging an edge of an n-type ion implantation photomask at a position in the polysilicon region which is shifted away from an edge of a p-type impurity implantation region.

In one embodiment of the invention, the step of forming the insulator section includes the steps of: forming a device separation insulator for separating an active region, in which a MOS transistor of the semiconductor integrated circuit is formed, from another such active region; implanting ions of a p-type impurity using the device separation insulator and a p-type ion implantation resist as masks; implanting ions of an n-type impurity using the device separation insulator and an n-type ion implantation resist as masks; and forming a silicide layer on a surface of the p-type anode high impurity concentration region and a surface of the n-type cathode high impurity concentration region.

In one embodiment of the invention, the method further includes, before the step of implanting ions of a p-type or n-type impurity, the step of: where the n-type cathode high impurity concentration region of the trigger diode of the thyristor forms a PN junction with a p-type substrate or a p-type well, arranging an edge of a p-type ion implantation photomask at a position on the device separation insulator at or near the center of the trigger diode which is shifted away from an edge of an n-type impurity implantation region.

In one embodiment of the invention, the method further includes, before the step of implanting ions of a p-type or n-type impurity, the step of: where the p-type anode high impurity concentration region of the trigger diode of the thyristor forms a PN junction with an n-type substrate or an n-type well, arranging an edge of an n-type ion implantation photomask at a position on the device separation insulator at or near the center of the trigger diode which is shifted away from an edge of a p-type impurity implantation region.

According to still another aspect of this invention, an electrostatic discharge protection circuit for bypassing an electrostatic surge entering a semiconductor integrated circuit through an input/output terminal thereof to a reference voltage line is provided. The electrostatic discharge protection circuit includes: the electrostatic discharge protection device having the trigger diode according to the present invention; and a protection diode. The electrostatic discharge protection device and the protection diode are arranged in parallel between an input/output signal line and the reference voltage line of the semiconductor integrated circuit. An anode and an anode gate of a thyristor provided in the electrostatic discharge protection device and a cathode of the protection diode are connected to the input/output signal line. A cathode and a cathode gate of the thyristor and an anode of the protection diode are connected to the reference voltage line. The electrostatic discharge protection device further includes a resistor, the resistor being formed in a well, which has a conductivity type opposite to that of a substrate, between the anode of the thyristor and the cathode of the protection diode.

According to still another aspect of this invention, an electrostatic discharge protection circuit for bypassing an electrostatic surge entering a semiconductor integrated circuit through an input/output terminal thereof to a power supply line is provided. The electrostatic discharge protection circuit includes: the electrostatic discharge protection device having the trigger diode according to the present invention; and a protection diode formed in an n-type substrate or an n-type well. The electrostatic discharge protection device and the protection diode are arranged in parallel between an input/output signal line and a power supply line of the semiconductor integrated circuit. An anode and an anode gate of a thyristor provided in the electrostatic discharge protection device and a cathode of the protection diode are connected to the power supply line of the semiconductor integrated circuit. A cathode of the thyristor and an anode of the protection diode are connected to the input/output signal line. A cathode gate of the thyristor is connected to the reference voltage line. The electrostatic discharge protection device further includes a resistor, the resistor being formed in a well, which has a conductivity type opposite to that of a substrate, between the cathode of the thyristor and the anode of the protection diode.

According to still another aspect of this invention, an electrostatic discharge protection circuit for bypassing an electrostatic surge entering a semiconductor integrated circuit through a power supply line thereof to a reference voltage line is provided. The electrostatic discharge protection circuit includes: the electrostatic discharge protection device having the trigger diode according to the present invention. The electrostatic discharge protection device is arranged between the power supply line and the reference voltage line of the semiconductor integrated circuit. An anode and an anode gate of a thyristor provided in the electrostatic discharge protection device are connected to the power supply line. A cathode and a cathode gate of the thyristor are connected to the reference voltage line.

In one embodiment of the invention, the n-type cathode high impurity concentration region and the p-type anode high impurity concentration region of the protection diode are produced according to the method of producing an electrostatic discharge protection device of the present invention.

According to still another aspect of this invention, an electrostatic discharge protection circuit for bypassing an electrostatic surge entering a semiconductor integrated circuit through any of an input/output terminal, a reference voltage terminal, and a power supply line thereof, to another of the input/output terminal, the reference voltage terminal, and the power supply terminal, is provided. The electrostatic discharge protection circuit includes: a first electrostatic discharge protection circuit according to the present invention; a second electrostatic discharge protection circuit according to the present invention; and a third electrostatic discharge protection circuit according to the present invention. The first electrostatic discharge protection circuit is provided between an input/output signal line and a reference voltage line of the semiconductor integrated circuit. The second electrostatic discharge protection circuit is provided between the input/output signal line and a power supply line of the semiconductor integrated circuit. The third electrostatic discharge protection circuit is provided between the power supply line and the reference voltage line.

According to still another aspect of this invention, an electrostatic discharge protection circuit for bypassing an electrostatic surge entering a semiconductor integrated circuit through any of an input/output terminal, a reference voltage terminal, and a power supply line thereof, to another of the input/output terminal, the reference voltage terminal, and the power supply terminal, is provided. The electrostatic discharge protection circuit includes first, second and third electrostatic discharge protection devices each having a trigger diode according to the present invention. An anode and an anode gate of a first thyristor provided in the first electrostatic discharge protection device are connected to a power supply line of the semiconductor integrated circuit. A cathode of the first thyristor is connected to an input/output signal line of the semiconductor integrated circuit. A cathode gate of the first thyristor is connected to a reference voltage line of the semiconductor integrated circuit. An anode and an anode gate of a second thyristor provided in the second electrostatic discharge protection device are connected to the input/output signal line of the semiconductor integrated circuit. A cathode and a cathode gate of the second thyristor are connected to the reference voltage line of the semiconductor integrated circuit. An anode and an anode gate of a third thyristor provided in the third electrostatic discharge protection device are connected to the power supply line of the semiconductor integrated circuit. A cathode and a cathode gate of the third thyristor are connected to the reference voltage line of the semiconductor integrated circuit.

According to still another aspect of this invention, an electrostatic discharge protection circuit for bypassing an electrostatic surge entering a semiconductor integrated circuit through any of an input/output terminal, a reference voltage terminal, and a power supply line thereof, to another of the input/output terminal, the reference voltage terminal, and the power supply terminal, is provided. The electrostatic discharge protection circuit includes: a first electrostatic discharge protection circuit according to the present invention; and a second electrostatic discharge protection circuit according to the present invention. The first electrostatic discharge protection circuit is provided between an input/output signal line and a reference voltage line of the semiconductor integrated circuit. The second electrostatic discharge protection circuit is provided between a power supply line and the reference voltage line of the semiconductor integrated circuit.

According to still another aspect of this invention, an electrostatic discharge protection circuit for bypassing an electrostatic surge entering a semiconductor integrated circuit through any of an input/output terminal, a reference voltage terminal, and a power supply line thereof, to another of the input/output terminal, the reference voltage terminal, and the power supply terminal, is provided. The electrostatic discharge protection circuit includes: a first electrostatic discharge protection device having a trigger diode according to the present invention between a reference voltage line and an input/output signal line of the semiconductor integrated circuit; and a second electrostatic discharge protection device having a trigger diode according to the present invention between the reference voltage line and a power supply line of the semiconductor integrated circuit. An anode and an anode gate of a first thyristor provided in the first electrostatic discharge protection device are connected to an input/output signal line of the semiconductor integrated circuit. A cathode and a cathode gate of the first thyristor are connected to the reference voltage line of the semiconductor integrated circuit. An anode and an anode gate of a second thyristor provided in the second electrostatic discharge protection device are connected to the power supply line of the semiconductor integrated circuit. A cathode and a cathode gate of the second thyristor are connected to the reference voltage line of the semiconductor integrated circuit.

Thus, the invention described herein makes possible the advantages of (1) providing an electrostatic discharge protection device which can be provided without adding any special step or photomask to the semiconductor integrated circuit production process even when a salicide step is employed in the semiconductor integrated circuit production; (2) providing a method for producing the same; and (3) providing an electrostatic discharge protection circuit using the same.

These and other advantages of the present invention will become apparent to those skilled in the art upon reading and understanding the following detailed description with reference to the accompanying figures.

DESCRIPTION OF THE PREFERRED EMBODIMENTS

The present invention will now be described in more detail by way of illustrative examples with reference to the accompanying drawings.

While a p-type semiconductor containing a low concentration of boron is used as a semiconductor substrate in the following examples of the present invention, it should be understood that the following description also applies to a semiconductor substrate containing a different impurity or an n-type semiconductor substrate.

Figure 1:
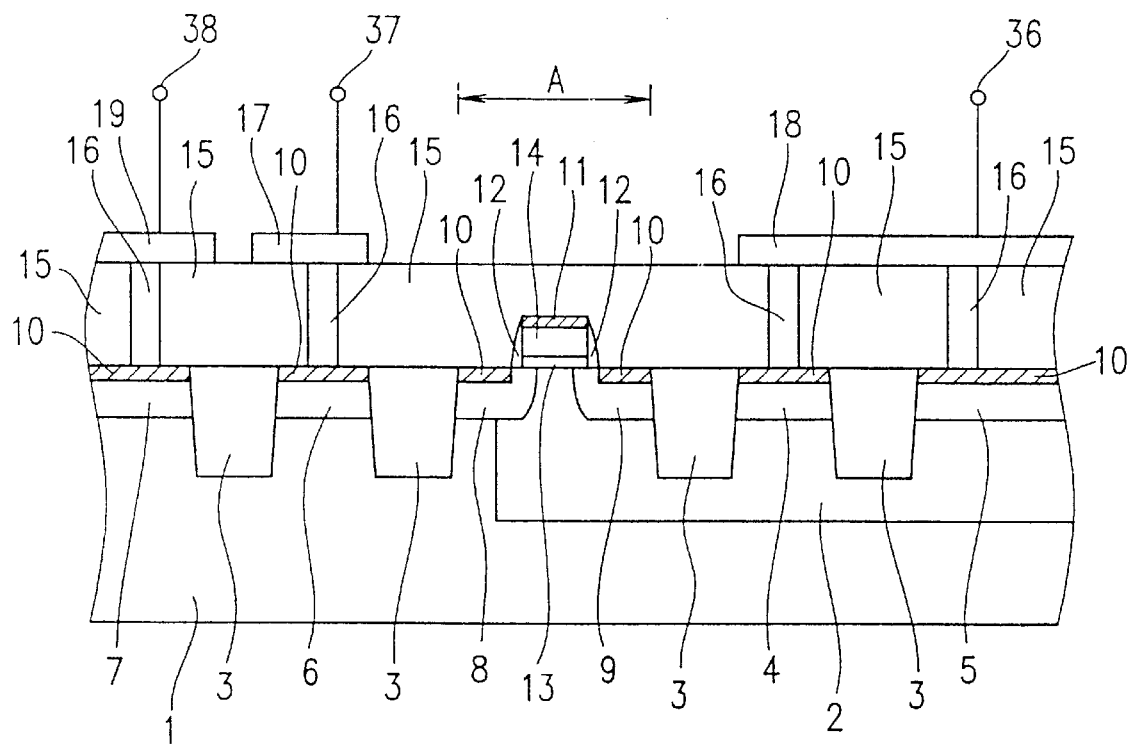
FIG. 1 is a cross-sectional view illustrating an electrostatic discharge protection device according to an example of the present invention.

FIG. 1 is a cross-sectional view illustrating one example of the present invention, and more particularly, a thyristor having a trigger diode as an electrostatic discharge protection device.

An n-type well 2 is provided in a p-type substrate 1. A p-type anode high impurity concentration region 4 and an n-type anode gate high impurity concentration region 5 are provided on the surface of the n-type well 2. A p-type cathode gate high impurity concentration region 7 and an n-type cathode high impurity concentration region 6 are provided on a portion of the surface of the p-type substrate 1 which is away from the n-type well 2. A silicide layer 10 is provided on the surface of each of the p-type anode high impurity concentration region 4, the n-type anode gate high impurity concentration region 5, the p-type cathode gate high impurity concentration region 7, and the n-type cathode high impurity concentration region 6. The silicide layer 10 is connected to a metal 17, 18 or 19 via a contact 16.

A trigger diode A, which triggers the operation of the thyristor, comprises a p-type high impurity concentration region 8, to be an anode of the trigger diode A, an n-type high impurity concentration region 9, to be a cathode thereof, and the n-type well 2. Provided above the regions 8 and 9 are a gate oxide film 13, a polysilicon 14, and gate sidewall insulators 12, which together form a gate of the MOS transistor of the semiconductor integrated circuit. A silicide layer 11 is provided on the polysilicon 14. The silicide layer 11 is formed along with the silicide layer 10 in a salicide step in the production of the semiconductor integrated circuit. No silicide layer is formed on the gate sidewall insulators 12. Therefore, the p-type high impurity concentration region 8, to be the anode of the trigger diode A, and the n-type high impurity concentration region 9, to be the cathode thereof, will not be shortcircuitted with each other by a silicide layer.

In the case of a thyristor which does not have the trigger diode A, the trigger voltage of the thyristor is determined by the breakdown voltage between the n-type well 2 and the p-type substrate 1. With the production process of a CMOS semiconductor integrated circuit, the trigger voltage will typically be as high as about 25 V to about 40 V. In contrast, the trigger voltage of the thyristor of the present invention is determined by the breakdown voltage between the p-type high impurity concentration region 8 of the trigger diode and the n-type well, whereby it is possible to provide a thyristor which can be turned ON by a low voltage.

Figure 2:
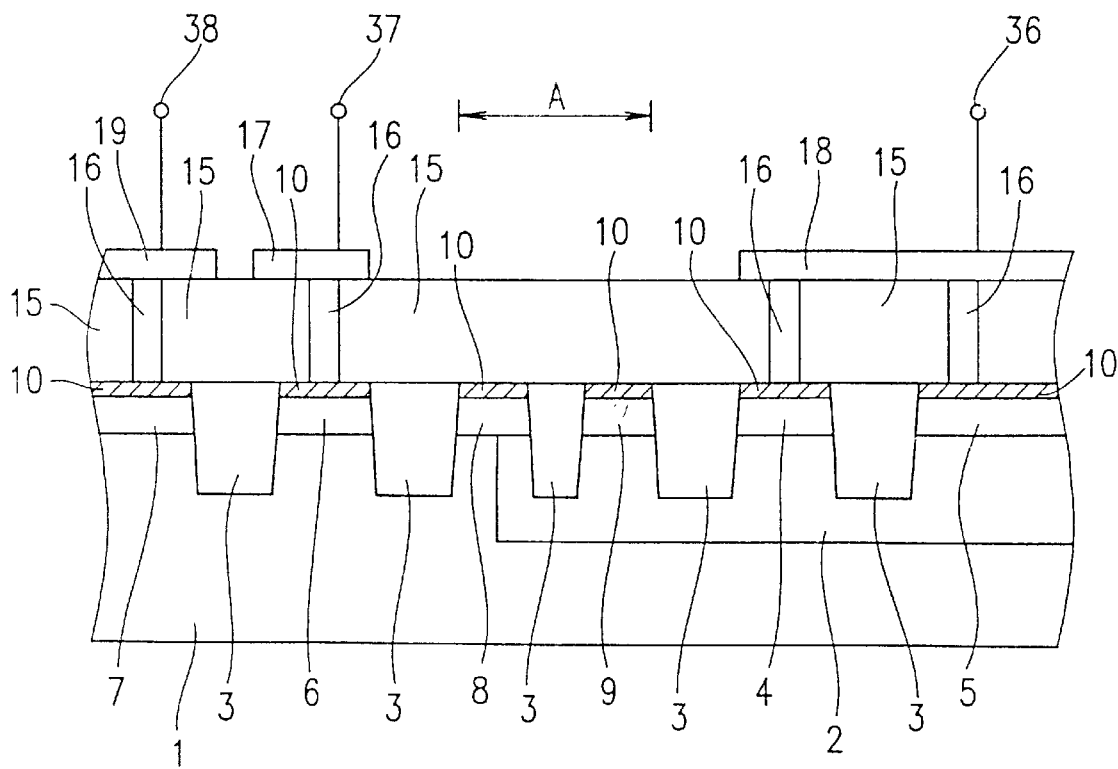
FIG. 2 is a cross-sectional view illustrating an electrostatic discharge protection device according to another example of the present invention.

FIG. 2 is a cross-sectional view illustrating an electrostatic discharge protection device according to another example of the present invention. The thyristor structure of FIG. 2 includes a device separation insulator 3 of the MOS transistor of the semiconductor integrated circuit between the p-type high impurity concentration region 8, to be the anode of the trigger diode A, and the n-type high impurity concentration region 9, to be the cathode thereof. No silicide layer is provided on the device separation insulator 3. Therefore, the p-type high impurity concentration region 8, to be the anode of the trigger diode A, and the n-type high impurity concentration region 9, to be the cathode thereof, are not shortcircuitted with each other by a silicide layer.

Figure 3:
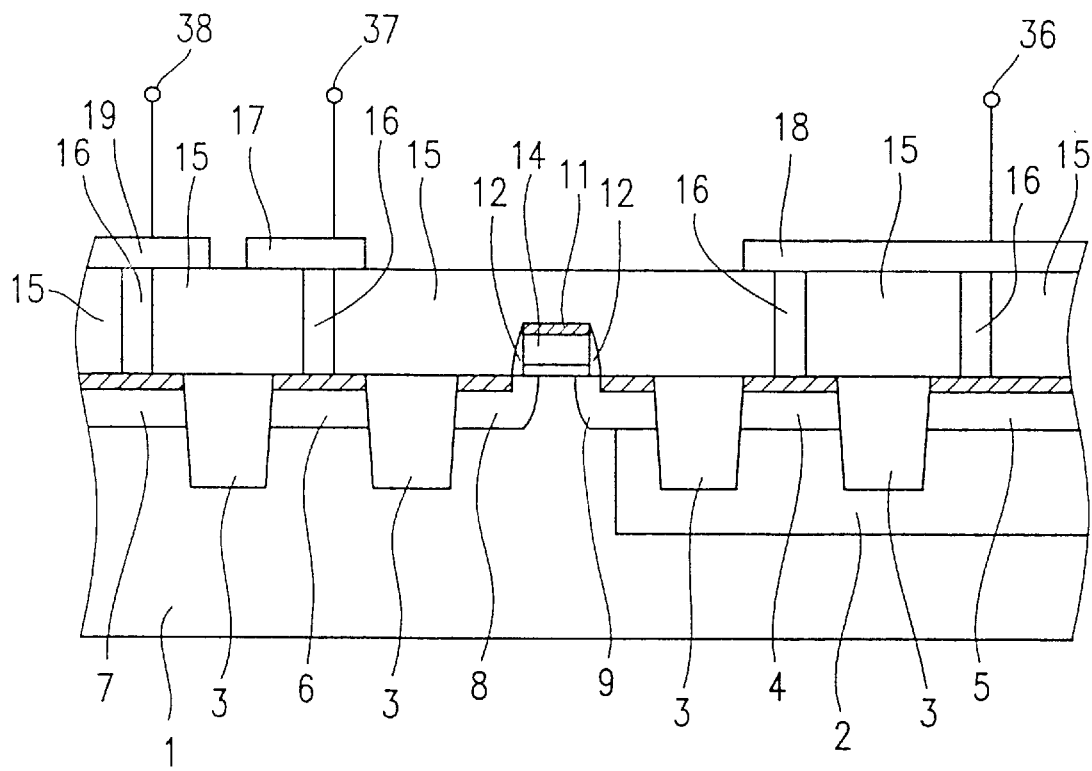
FIG. 3 is a cross-sectional view illustrating an electrostatic discharge protection device according to still another example of the present invention.

FIG. 3 is a cross-sectional view illustrating an electrostatic discharge protection device according to still another example of the present invention. Each of FIGS. 1 and 2 shows an electrostatic discharge protection device in which the breakdown voltage between the p-type high impurity concentration region 8, to be the anode of the trigger diode A, and the n-type well 2, is used as a trigger voltage for the operation of the thyristor. On the other hand, FIG. 3 illustrates a structure in which the breakdown voltage between the n-type high impurity concentration region 9, to be the cathode of the trigger diode, and the p-type substrate 1 is used as a trigger voltage. Such a structure illustrated in FIG. 3 can also provide a thyristor which can be triggered by a low voltage, and in which the anode and the cathode of the trigger diode A will not be shortcircuitted with each other by a silicide layer. In the structure of FIG. 3, a portion of the n-type high impurity concentration region 9, to be the cathode of the trigger diode, is included in the p-type substrate 1, and another portion thereof is included in the n-type well 2.

Figure 4:
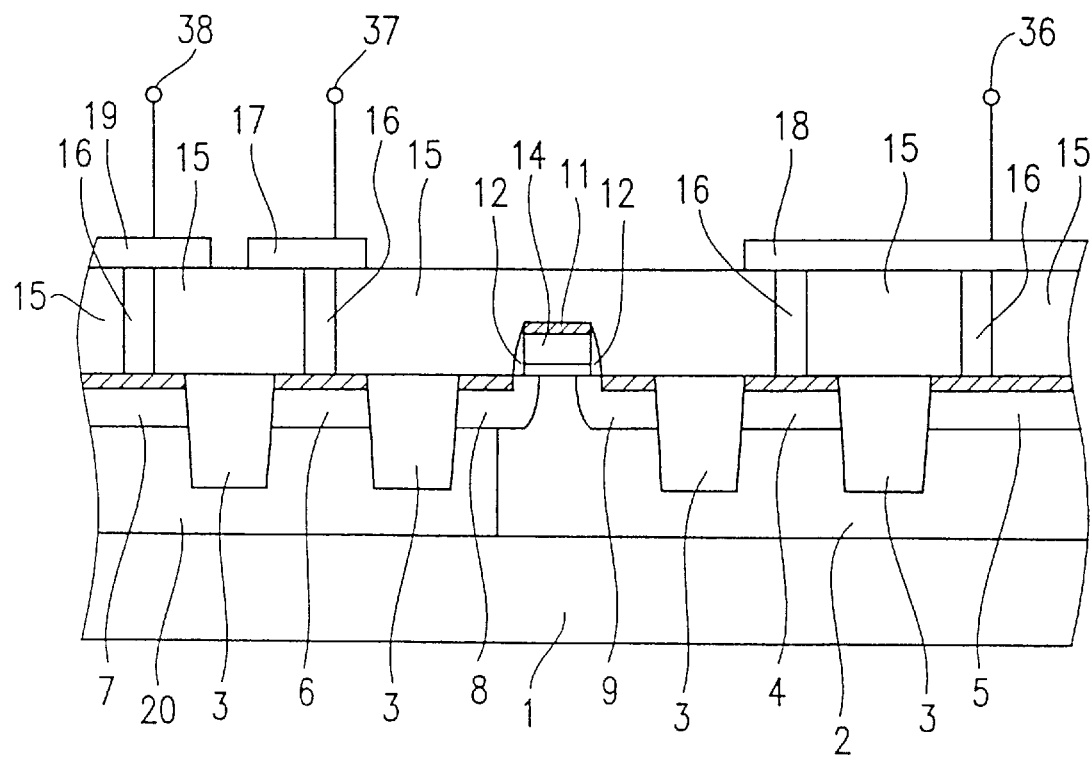
FIG. 4 is a cross-sectional view illustrating an electrostatic discharge protection device according to still another example of the present invention.

FIG. 4 is a cross-sectional view illustrating an electrostatic discharge protection device according to a further example of the present invention. Typically, in the production of a CMOS semiconductor integrated circuit, a p-type well, which has a higher impurity concentration than that of the p-type substrate 1, is provided in addition to the n-type well 2 provided on the p-type substrate 1. The structure of FIG. 4 includes a p-type well 20 in addition to the structure as illustrated in FIG. 1. Also with the structure illustrated in FIG. 4, it is possible to obtain a thyristor which can be triggered by a low voltage.

Now, a method for producing the electrostatic discharge protection device illustrated in FIG. 1 will be described with reference to FIGS. 5 to 11. Each of FIGS. 5 to 10 illustrates a cross-sectional view of the device at respective one of main steps of the production. FIG. 11 is a flow chart illustrating production steps of the electrostatic discharge protection device.

Figure 5:
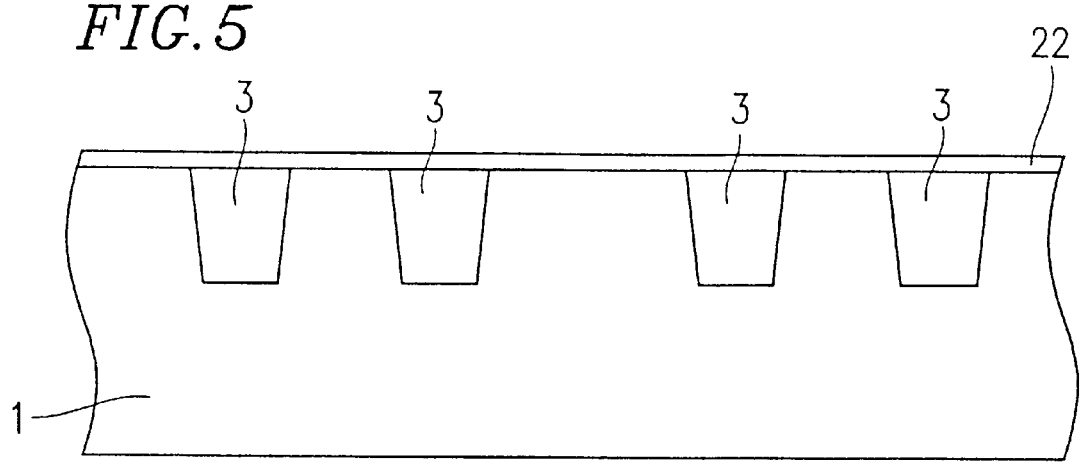
FIG. 5 is a cross-sectional view illustrating a step of forming a device separation insulator, employed in the process of producing the electrostatic discharge protection device according to an example of the present invention.
Figure 6:
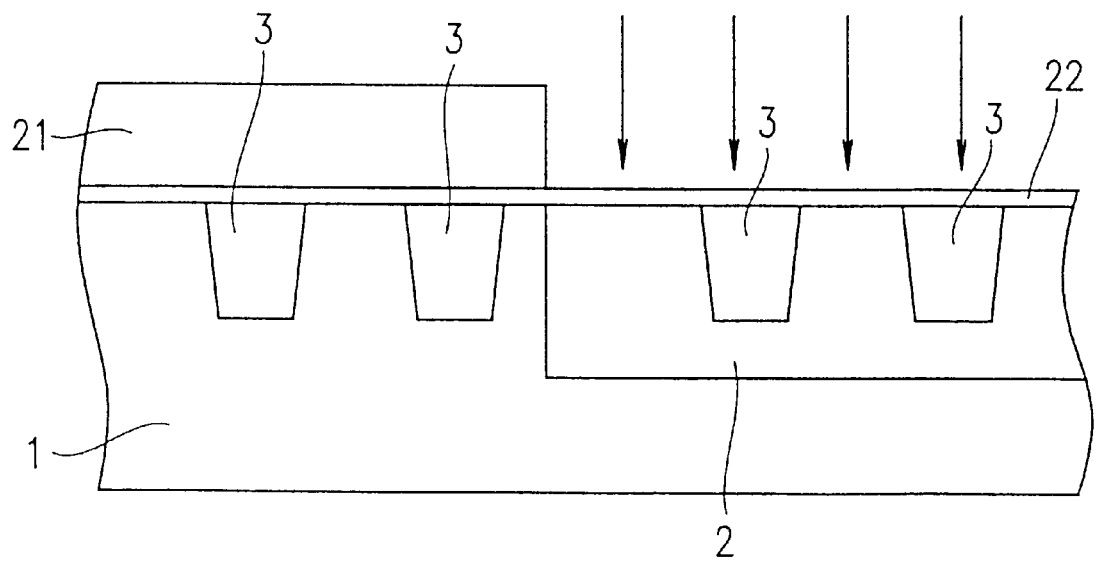
FIG. 6 is a cross-sectional view illustrating a step of forming an n-type well, employed in the process of producing the electrostatic discharge protection device according to an example of the present invention.
Figure 7:
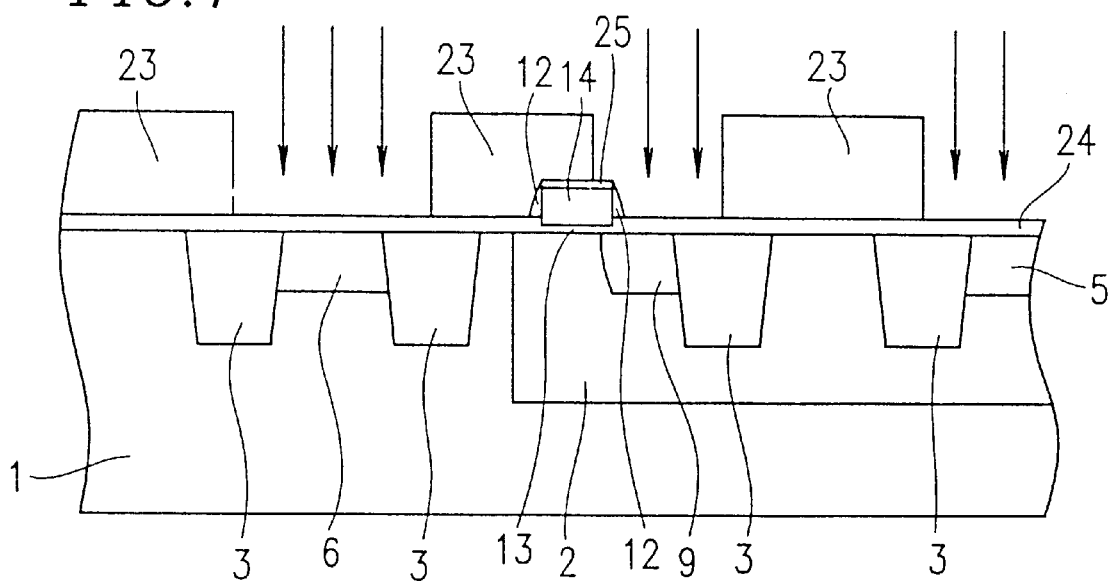
FIG. 7 is a cross-sectional view illustrating a step of implanting an n-type impurity after forming gate sidewall insulators, employed in the process of producing the electrostatic discharge protection device according to an example of the present invention.
Figure 8:
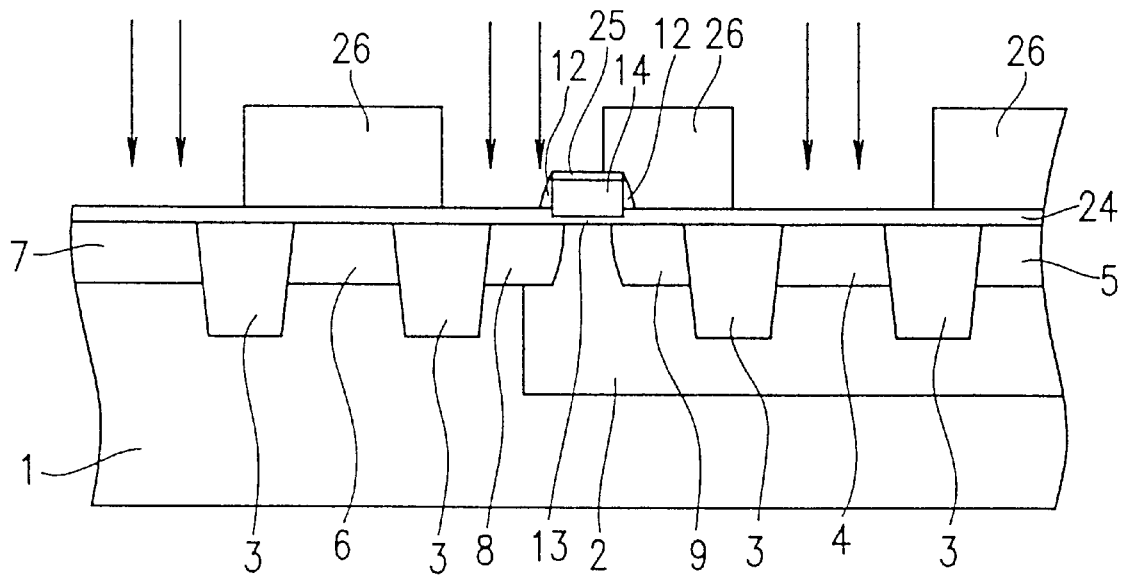
FIG. 8 is a cross-sectional view illustrating a step of implanting a p-type impurity after patterning a photoresist, employed in the process of producing the electrostatic discharge protection device according to an example of the present invention.
Figure 9:
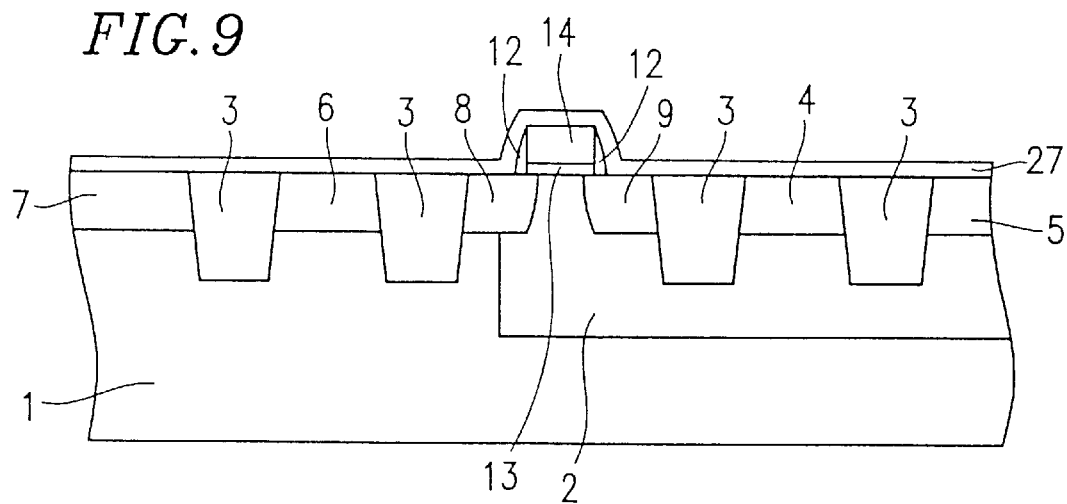
FIG. 9 is a cross-sectional view illustrating a step of depositing a high melting point metal, employed in the process of producing the electrostatic discharge protection device according to an example of the present invention.
Figure 10:
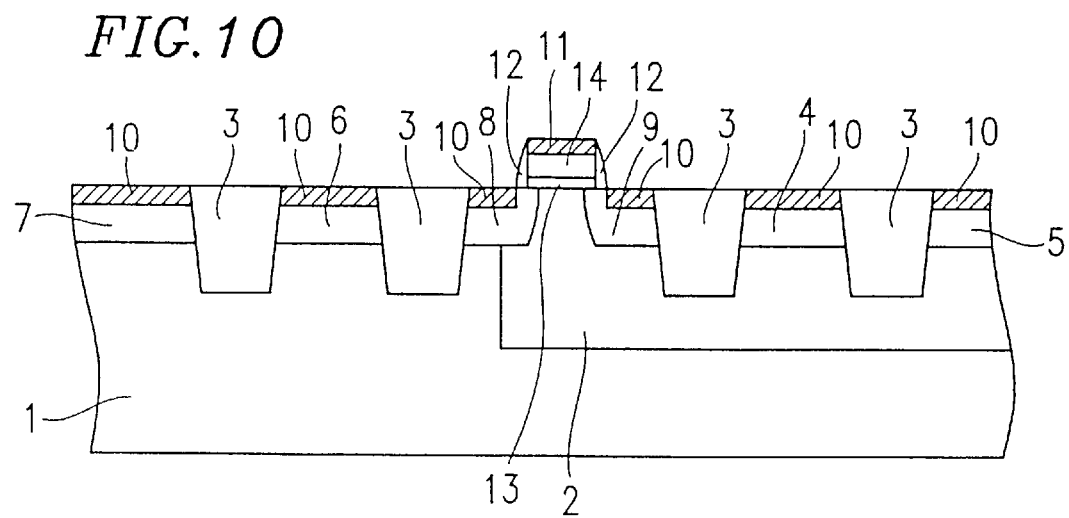
FIG. 10 is a cross-sectional view illustrating a step of stripping unreacted high melting point metal after forming silicide layers, employed in the process of producing the electrostatic discharge protection device according to an example of the present invention.
Figure 11:
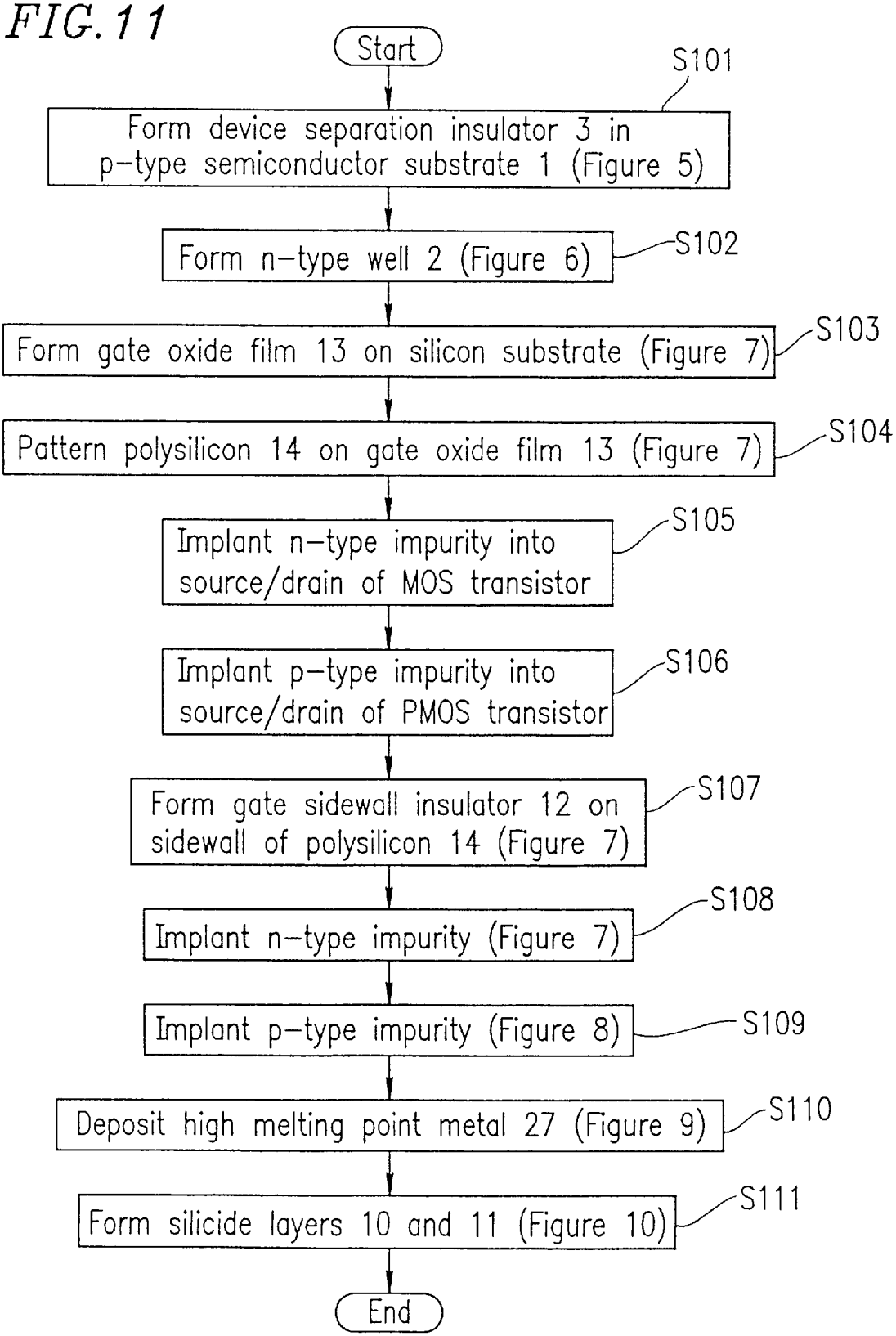
FIG. 11 is a flow chart illustrating the production steps of the electrostatic discharge protection device according to an example of the present invention.

Specifically, FIG. 5 is a cross-sectional view illustrating a step of forming the device separation insulator 3, FIG. 6 a step of forming then-type well 2, FIG. 7 a step of forming the gate sidewall insulator 12, FIG. 8 a step of patterning a photoresist 26, FIG. 9 a step of depositing a high melting point metal 27, and FIG. 10 a step of forming the silicide layers 10 and 11.

The steps illustrated in these figures are those for producing the electrostatic discharge protection device illustrated in FIG. 1. The electrostatic discharge protection device illustrated in FIG. 2 can be produced in substantially the same way, by substituting the structure of the trigger diode A of FIG. 1 (which corresponds to the gate section of a MOS transistor) with the device separation insulator 3.

Referring to FIGS. 5 to 11, the method will be described below in more detail. First, as shown in FIG. 5, the device separation insulator 3 is formed on the p-type substrate 1 (S101 in FIG. 11). While the formation of the device separation insulator 3 can be done by any appropriate method, a LOCOS (local oxidation of silicon) method and a shallow trench isolation method are commonly used. Any region not covered with the device separation insulator 3 is covered with a thin oxide film 22.

Then, as shown in FIG. 6, an n-type well formation photoresist 22 is applied across the entire surface of the wafer, and then patterned by a photolithography process using an n-type well injection photomask. Thereafter, an n-type impurity is injected into the wafer. Then, a p-type impurity may optionally be injected using a p-type well injection photomask, so as to form a p-type well. The photoresist is removed, and a heat treatment is performed to diffuse the n-type impurity so as to form the n-type well 2 (S102 in FIG. 11).

Then, as shown in FIG. 7, the thin oxide film 22 is etched away, and an oxidization process is performed so as to form a gate oxide film 13 of the MOS transistor on the silicon substrate (S103). A polysilicon is deposited on the entire surface of the wafer, and a photoresist is applied thereon. A photolithography process is performed using a gate formation photomask so as to pattern the photoresist into a gate resist, and a polysilicon etching process is performed so as to pattern the polysilicon 14 on the gate oxide film 13 (S104). The photoresist is removed, and an oxidization process is performed so as to grow a thin oxide film across the entire surface. A photoresist is applied on the entire surface of the wafer, and a photoresist process is performed using an NMOS transistor LDD implantation mask so as to pattern the photoresist into an NMOS transistor LDD implantation resist. Then, an n-type impurity is implanted into a source/drain region of the NMOS transistor (S105). At this time, a p-type impurity may also be implanted so as to suppress the short channel effect of the NMOS transistor. Moreover, an impurity may be implanted into the n-type anode gate high impurity concentration region 5, the n-type cathode high impurity concentration region 6, and the n-type high impurity concentration region 9 of the electrostatic discharge protection device illustrated in FIG. 1 or 2.

The photoresist is removed, and a photoresist is again applied on the entire surface. A photoresist process is performed using a PMOS transistor LDD implantation mask so as to pattern the photoresist into a PMOS transistor LDD implantation resist. Then, a p-type impurity is implanted into the source/drain region of the PMOS transistor (S106). At this time, an n-type impurity may also be implanted so as to suppress the short channel effect of the PMOS transistor. Moreover, an impurity may be implanted into the p-type high impurity concentration region 4, the p-type cathode gate high impurity concentration region 7, and the p-type high impurity concentration region 8 of the electrostatic discharge protection device illustrated in FIG. 1 or 2.

The photoresist is removed, and an oxide film is deposited on the entire surface. The surface is subjected to an anisotropic oxide film etching process so as to form the gate sidewall insulator 12 on the sidewall of the polysilicon 14 (S107). Thin oxide films 24 and 25 are deposited, and a photoresist is applied on the entire surface. A photoresist process is performed using a NMOS transistor source/drain implantation mask so as to pattern the photoresist into an NMOS transistor source/drain implantation photoresist 23. Then, an n-type impurity is implanted. In this step, an n-type impurity is implanted into the n-type anode gate high impurity concentration region 5, the n-type cathode high impurity concentration region 6, and the n-type high impurity concentration region 9 (S108). The photoresist is removed, and a photoresist is applied on the entire surface.

As shown in FIG. 8, a photoresist process is performed using a PMOS transistor source/drain implantation mask so as to pattern the photoresist into a PMOS transistor source/drain impurity photoresist 26. Then, a p-type impurity is implanted (S110). In this step, a p-type impurity is implanted into the p-type anode high impurity concentration region 4, the p-type cathode gate high impurity concentration region 7, and the p-type high impurity concentration region 8 of the electrostatic discharge protection device illustrated in FIG. 1 or 2 (S109).

As shown in FIG. 9, the photoresist is removed, and the oxide film on the silicon active region and the oxide film on the polysilicon are removed. Then, the high melting point metal 27 is deposited (S110).

As shown in FIG. 10, a heat treatment is performed so as to form the silicide layers 10 and 11 on the surface of the silicon substrate and on the surface of the polysilicon 14, respectively. Then, unreacted high melting point metal is stripped away (S111). No silicide layer is formed on the surface of the device separation insulator 3 or on the surface of the gate sidewall insulator 12. Since no silicide layer is provided on the gate sidewall insulator 12, the p-type high impurity concentration region 8 and the n-type high impurity concentration region 9, which together form a trigger diode, will not be electrically shortcircuited. Then, an interlayer insulator is deposited on the entire surface, and the deposited insulator is flattened. A photoresist is applied on the entire surface, and patterned into a contact hole opening resist using a contact hole formation photomask. The interlayer insulator is etched so as to open contact holes, and then a metal is deposited on the entire surface of the wafer. Then, the metal is patterned using a metal photomask, thereby completing the electrostatic discharge protection device illustrated in FIG. 1 or 2.

The photomask layout employed for implanting an impurity into the p-type high impurity concentration region and the n-type high impurity concentration region, which together form the trigger diode of the electrostatic discharge protection device, will be described below with reference to FIGS. 12 to 14. While the layout described below is an exemplary layout which is suitably used for providing the trigger diode section of the electrostatic discharge protection device, the layout may also be used for providing protection diodes of an electrostatic discharge protection circuit, which will later be further described.

Figure 12:
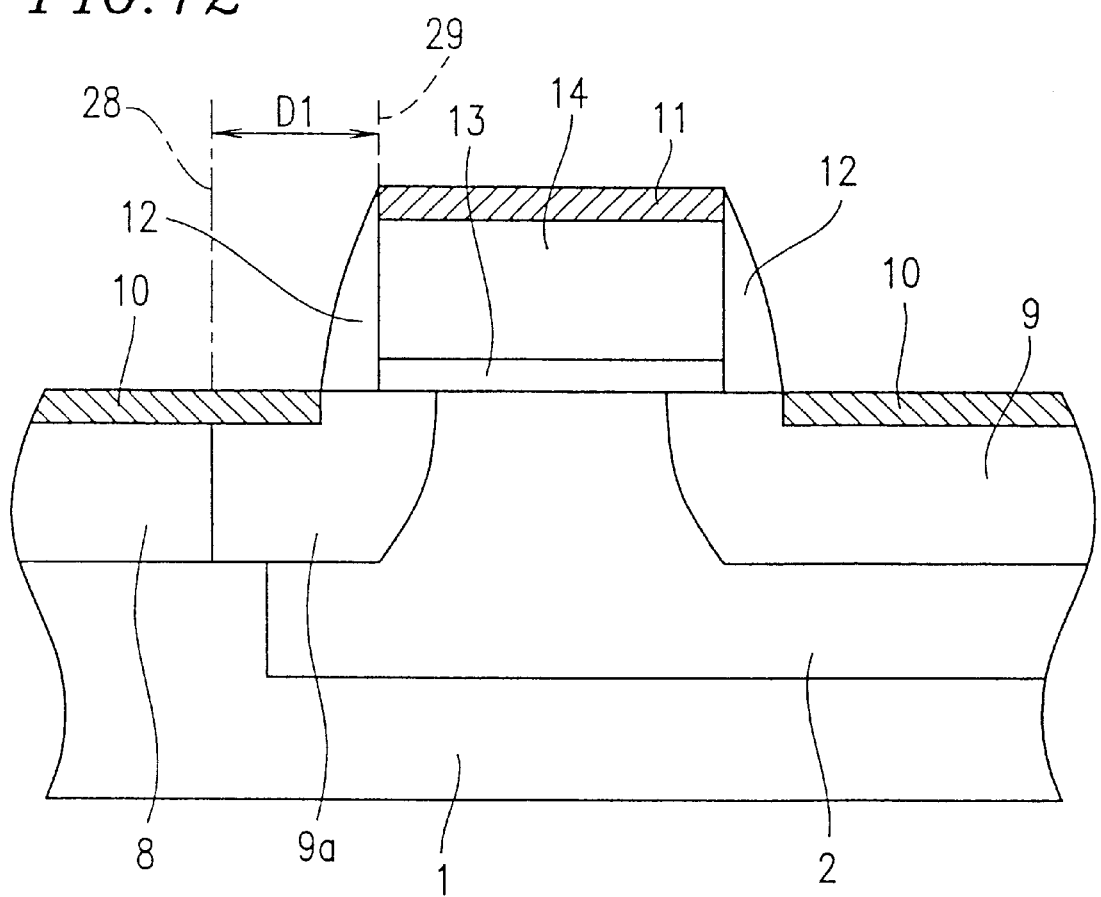
FIG. 12 is a cross-sectional view illustrating an undesirable example of a production step for providing an electrostatic discharge protection device.

FIG. 12 is a cross-sectional view illustrating an undesirable example of a production step for providing an electrostatic discharge protection device. FIG. 12 shows an enlarged cross section of the trigger diode section A of the electrostatic discharge protection device illustrated in FIG. 1. Referring to FIG. 12, an n-type high concentration impurity is implanted into a portion of the p-type high impurity concentration region 8, to be an anode of the trigger diode, thereby forming an n-type impurity region 9a therein. This may occur when the NMOS transistor source/drain implantation photomask is misaligned while implanting an impurity into a source/drain region of the NMOS transistor of the semiconductor integrated circuit, with an edge of the photomask being positioned along a position 28 which is shifted from an edge 29 of the gate polysilicon 14 toward the anode. The n-type impurity region 9a may be formed if the n-type impurity concentration is any higher than the p-type impurity concentration. In a salicide step, the silicide layer 10 is formed on the surface of the p-type high impurity concentration region 8 and the surface of the n-type impurity region 9a, thereby electrically shortcircuiting the p-type high impurity concentration region 8 and the n-type impurity region 9a with each other. Since the n-type impurity region 9a, the n-type well 2, and the n-type impurity region 9 are of the same conductivity type, the anode and the cathode of the trigger diode are shortcircuited with each other. When the anode and the cathode are shortcircuited with each other, the reverse breakdown of the trigger diode will not occur, while the anode gate and the cathode gate of the thyristor, which is an electrostatic discharge protection device comprising a trigger diode, are shortcircuited with each other. In such a case, a leak current may occur from the anode gate, which is normally at a higher potential, to the cathode gate, which is normally at a reference potential, thereby hampering the normal operation of the semiconductor integrated circuit.

Figure 13:
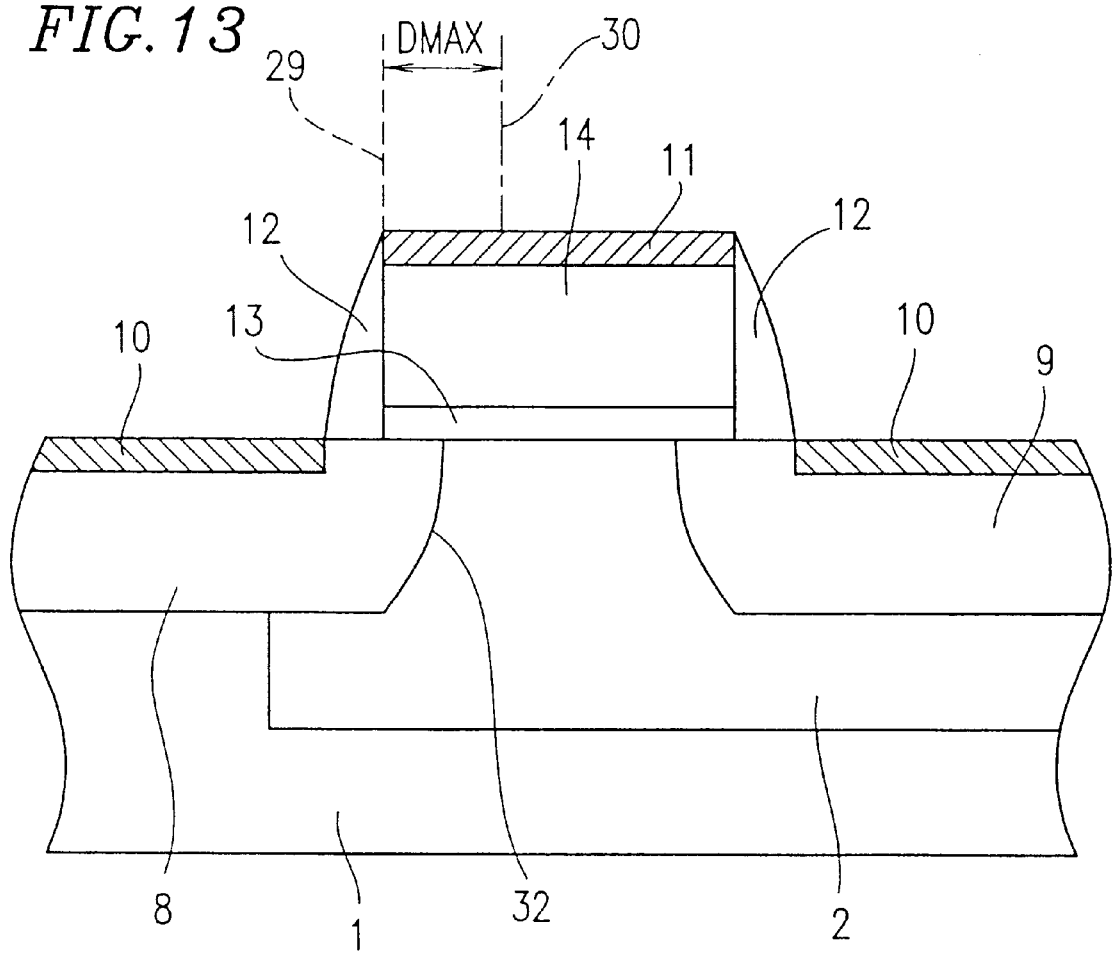
FIG. 13 is a cross-sectional view illustrating a method of providing an electrostatic discharge protection device according to an example of the present invention.

FIG. 13 is a cross-sectional view illustrating a method of providing an electrostatic discharge protection device according to an example of the present invention. FIG. 13 illustrates a desirable layout of the NMOS transistor source/drain implantation photomask where no shortcircuitting path is formed between the anode and the cathode of the trigger diode. In this layout, an edge 30 of the NMOS transistor source/drain implantation photomask is arranged at a position in the polysilicon region which is shifted toward the cathode from the edge 29 of the gate polysilicon 14 (an edge of the impurity implanted region) by a distance DMAX corresponding to the maximum misalignment of the NMOS transistor source/drain implantation photomask with respect to the gate polysilicon 14 which may possibly occur during the production of a semiconductor integrated circuit. In this way, it is possible to avoid the implantation of an n-type high concentration impurity on the anode side.

The above-described layout can also be used in the process of forming a protection diode in an n-type substrate or an n-type well which will later be further described with reference to FIG. 16. In a structure where the anode and the cathode of a trigger diode are insulated from each other by the device separation insulator 3 as illustrated in FIG. 2, the edge 30 of the NMOS transistor source/drain implantation photomask can be shifted toward the cathode from an edge of the device separation insulator 3 by a distance corresponding to the maximum misalignment which may possibly occur therebetween.

Figure 14:
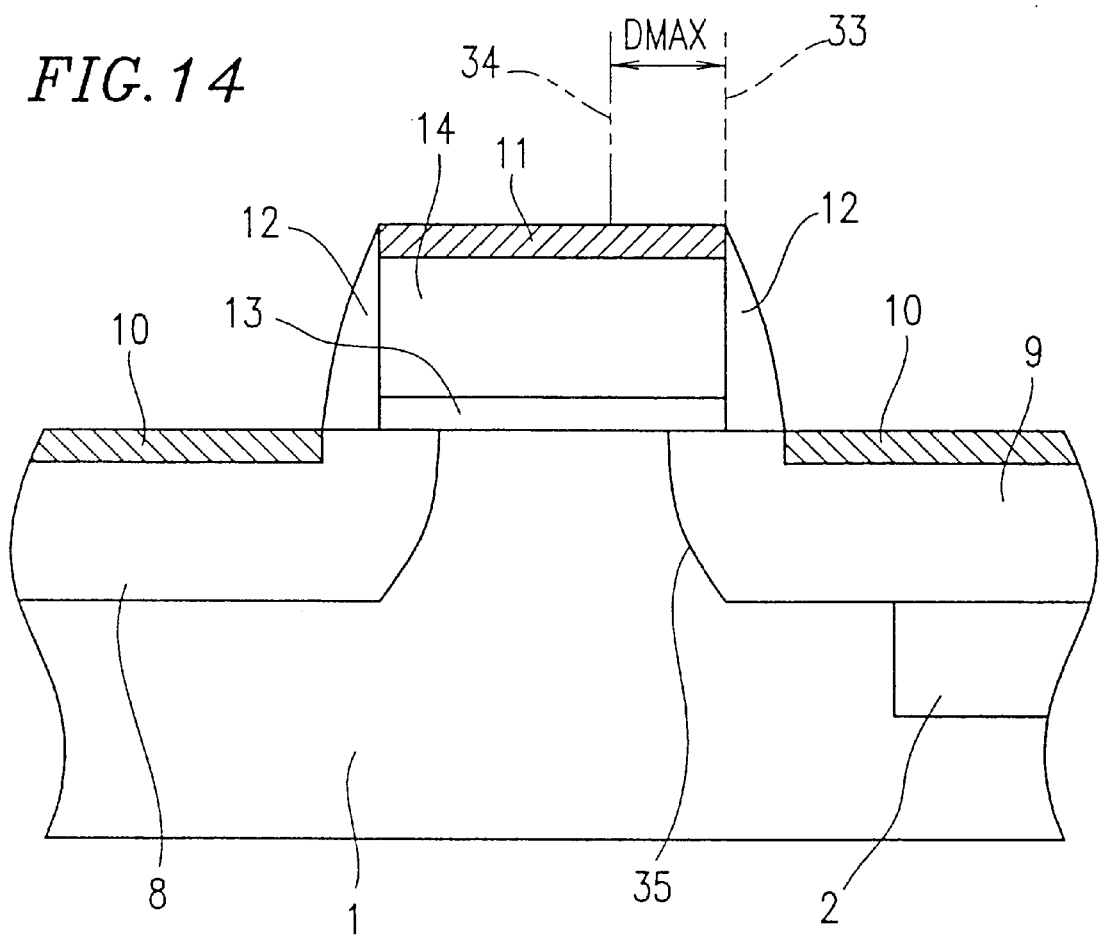
FIG. 14 is a cross-sectional view illustrating a method of providing an electrostatic discharge protection device according to another example of the present invention.

FIG. 14 is an enlarged cross-sectional view illustrating the trigger diode section in the electrostatic discharge protection device illustrated in FIG. 3 which is triggered by the breakdown between the n-type high impurity concentration region 9 to be the cathode of the trigger diode and the p-type substrate 1. Where a p-type high concentration impurity is implanted into the n-type high impurity concentration region 9 during the implantation into the PMOS source/drain region, if the p-type impurity concentration is higher than the n-type impurity concentration, a p-type impurity region is formed in a portion of the n-type high impurity concentration region 9 on the side of the gate 14. Then, the n-type high impurity concentration region 9, the p-type substrate 1, and the p-type high impurity concentration region 8 are shortcircuitted with one another by the silicide layer, thereby shortcircuiting the anode and the cathode of the trigger diode.

FIG. 14 is a cross-sectional view illustrating another method of producing an electrostatic discharge protection device according to an example of the present invention. FIG. 14 illustrates a position of the PMOS transistor source/drain implantation photomask such that no shortcircuitting path is formed between the anode and the cathode of the trigger diode.

In this layout, an edge 34 of the PMOS transistor source/drain implantation photomask is arranged at a position in the polysilicon region which is shifted toward the anode from an edge 33 of the gate polysilicon (an edge of the impurity implanted region) by a distance DMAX corresponding to the maximum misalignment of the PMOS transistor source/drain implantation photomask with respect to the gate polysilicon which may possibly occur during the production of a semiconductor integrated circuit. In this way, it is possible to avoid the implantation of a p-type high concentration impurity on the cathode side.

Figure 17:
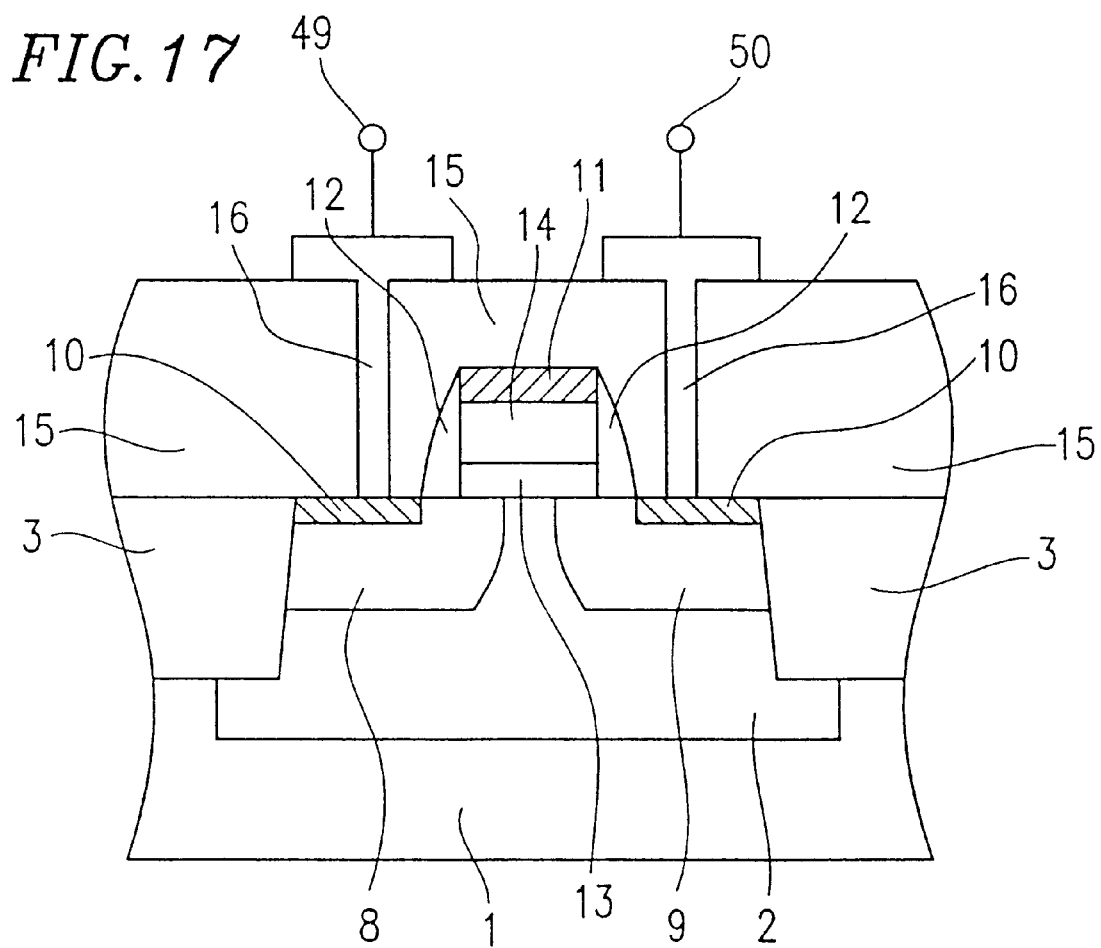
FIG. 17 is a cross-sectional view illustrating another example of the protection diode provided in the electrostatic discharge protection circuit of the present invention.

The above-described layout can also be used in the process of forming a protection diode in a p-type substrate or a p-type well which is illustrated in FIG. 17. In a structure where the anode and the cathode of a trigger diode are insulated from each other by the device separation insulator 3 as illustrated in FIG. 2, the edge 34 (FIG. 14) of the PMOS transistor source/drain implantation photomask can be shifted toward the cathode from an edge of the device separation insulator 3 by a distance DMAX corresponding to the maximum misalignment which may possibly occur therebetween.

An example of an electrostatic discharge protection circuit including the electrostatic discharge protection device of the present invention will be described in detail below with reference to FIGS. 15, 18 and 19.

Figure 15:
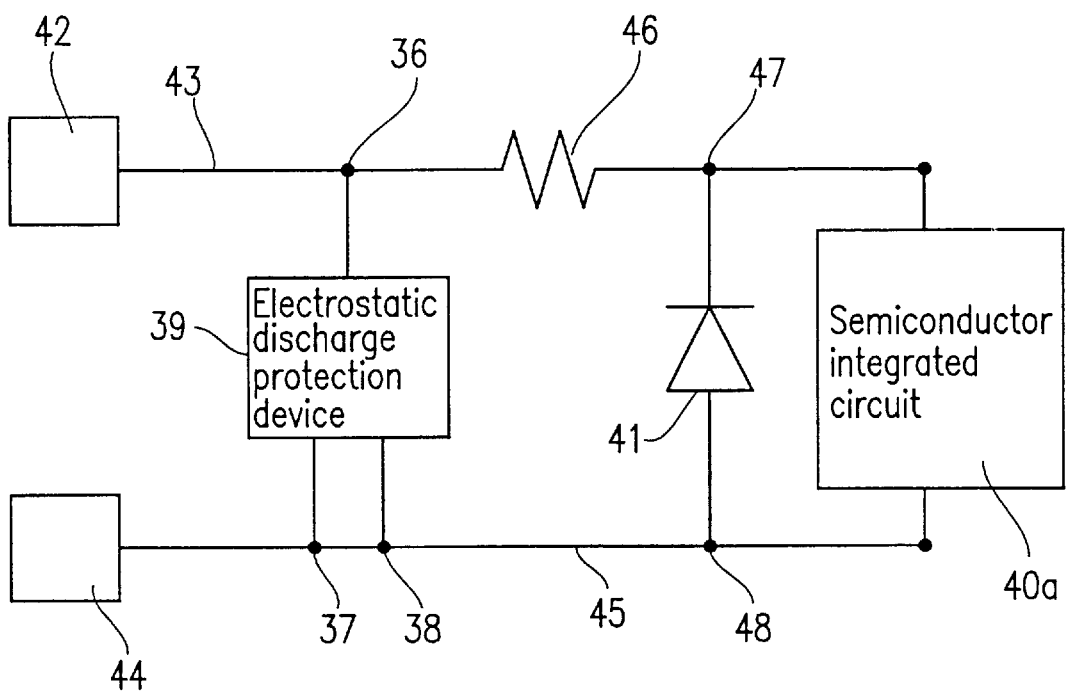
FIG. 15 is a schematic diagram illustrating an electrostatic discharge protection circuit including the electrostatic discharge protection device according to an example of the present invention.

FIG. 15 is a schematic diagram illustrating an electrostatic discharge protection circuit including the electrostatic discharge protection device according to an example of the present invention. FIG. 15 illustrates an example where the electrostatic discharge protection circuit includes the electrostatic discharge protection device of the present invention between an input/output signal line and a reference voltage line.

The electrostatic discharge protection circuit includes an electrostatic discharge protection device 39 of the present invention, a protection diode 41, and a well resistor 46. The anode terminal 36 of the electrostatic discharge protection device 39 is connected to an input/output signal line 43, and a cathode terminal 37 and a cathode gate terminal 38 are connected to a reference voltage line 45. A semiconductor integrated circuit 40a to be electrostatically protected is connected between the input/output signal line 43 and the reference voltage line 45. The well resistor 46 may be made of an n-type well when the semiconductor substrate is of p type, or a p-type well when the semiconductor substrate is of n type. The protection diode 41 is provided in the step of producing the electrostatic discharge protection device 39. The protection diode 41 includes the p-type anode high impurity concentration region 8 (FIG. 1) and the n-type cathode high impurity concentration region 9 provided in a p-type or n-type well.

Figure 16:
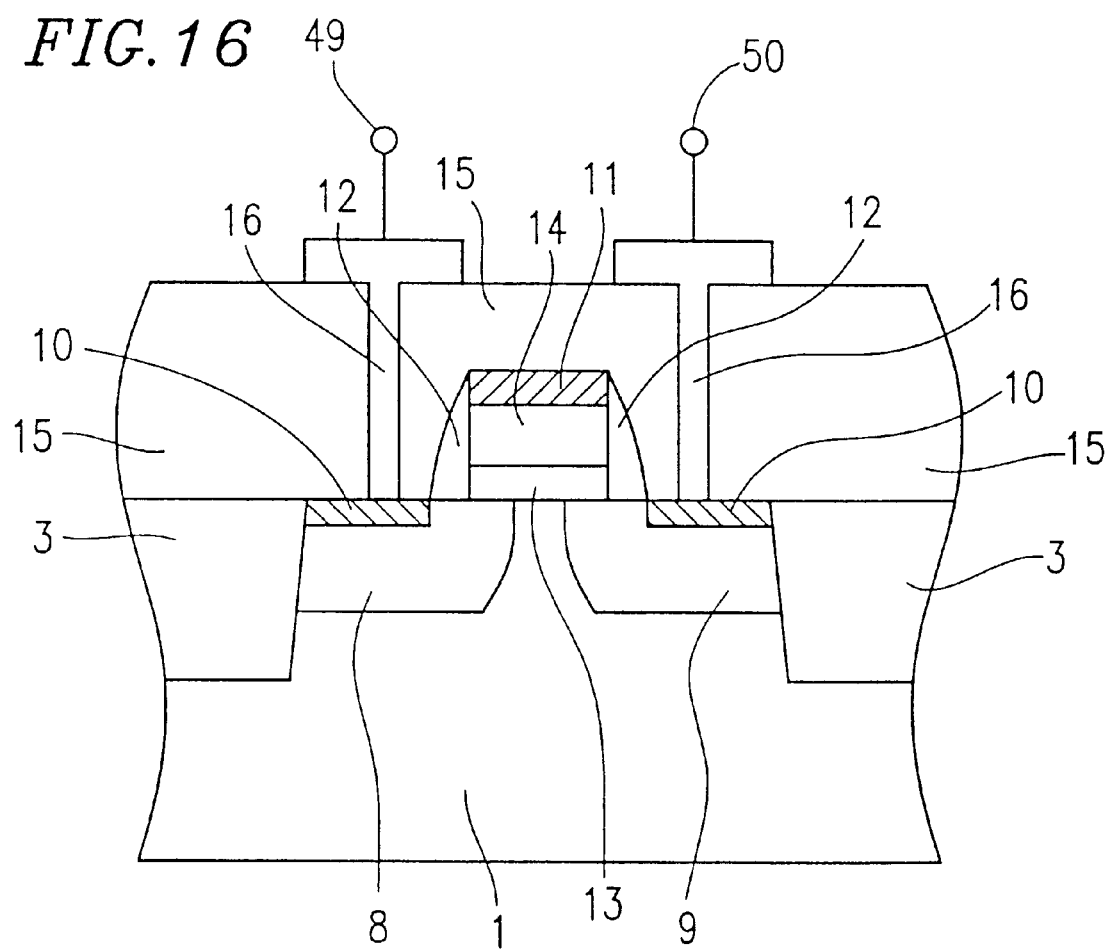
FIG. 16 is a cross-sectional view illustrating an example of a protection diode provided in the electrostatic discharge protection circuit of the present invention.

FIG. 16 is a cross-sectional view illustrating an example of the protection diode 41 (FIG. 15) provided in the electrostatic discharge protection circuit of the present invention. FIG. 17 is a cross-sectional view illustrating another example of the protection diode 41 (FIG. 15) provided in the electrostatic discharge protection circuit of the present invention. In both examples of FIGS. 16 and 17, the protection diode 41 is provided on a p-type substrate 1. In the protection diode 41, as in the trigger diode of the electrostatic discharge protection device, the anode and the cathode are insulated from each other by a gate structure (including the gate sidewall insulator 12, the gate oxide film 13, and the polysilicon 14) so as to prevent the p-type anode high impurity concentration region 8 and the n-type cathode high impurity concentration region 9 from being shortcircuitted with each other by a silicide layer. The insulation between the p-type anode high impurity concentration region 8 and the n-type cathode high impurity concentration region 9 may alternatively be provided by using the device separation insulator 3, as in the trigger diode A of FIG. 2. The n-type cathode high impurity concentration region 9 of the protection diode 41 is connected to the input/output signal line 43, and the anode 8 is connected to the reference voltage line 45.

When a positive electrostatic charge flows through an input/output terminal 42 into the electrostatic discharge protection circuit illustrated in FIG. 15, breakdown occurs at the PN junction in the protection diode 41, whereby a breakdown current flows through the protection diode 41. When the breakdown current flows through the protection diode 41, the anode terminal 36 is brought to a high voltage by the well resistor 46. Then, the electrostatic discharge protection device 39, whose turn-on voltage is slightly larger than the breakdown voltage of the protection diode 41, is turned ON, so as to create a low-resistance bypass between the input/output signal line 43 and the reference voltage line 45. Thus, the electrostatic charge entering through the input/output terminal 42 can be bypassed to the reference voltage line 45 through the electrostatic discharge protection device 39.

When a positive electrostatic charge flows into the circuit through the reference voltage terminal 44, the diode in the electrostatic discharge protection device 39 (including the p-type cathode gate high impurity concentration region 7, the p-type substrate 1, the n-type well 2, and the n-type anode gate high impurity concentration region 5) is biased in the forward direction, while the protection diode 41 is also biased in the forward direction. Therefore, the positive electrostatic charge entering through the reference voltage terminal 44 can be bypassed to the input/output signal line 43 and to the input/output terminal 42.

Figure 18:
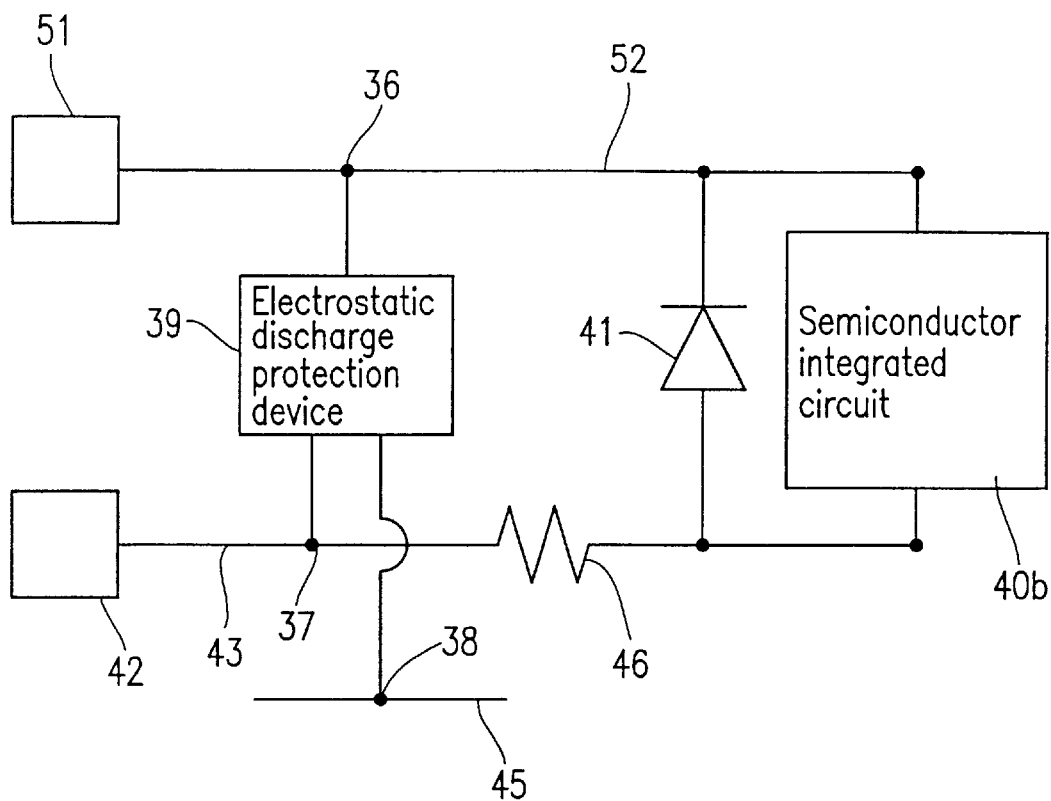
FIG. 18 is a schematic diagram illustrating another example of an electrostatic discharge protection circuit including the electrostatic discharge protection device according to an example of the present invention.

FIG. 18 is a schematic diagram illustrating another example of an electrostatic discharge protection circuit including the electrostatic discharge protection device according to an example of the present invention. FIG. 18 illustrates an example where an electrostatic discharge protection circuit is provided between a voltage supply line and an input/output signal line by using the electrostatic discharge protection device 39 of the present invention.

The electrostatic discharge protection circuit includes the electrostatic discharge protection device 39 of the present invention, the protection diode 41, and the well resistor 46. The anode terminal 36 of the electrostatic discharge protection device 39 is connected to a power supply line 52, the cathode terminal 37 to the input/output signal line 43, and the cathode gate terminal 38 to the reference voltage line 45. A semiconductor integrated circuit 40b to be electrostatically protected is connected between the power supply line 52 and the input/output signal line 43.

The protection diode 41 is provided in the step of producing the electrostatic discharge protection device 39. The protection diode 41 includes the p-type anode high impurity concentration region 8 (FIG. 17) and the n-type cathode high impurity concentration region 9 provided in an n-type well. FIG. 17 illustrates an example of the protection diode 41 provided in the n-type well 2 on the p-type substrate 1. The n-type cathode high impurity concentration region 9 of the protection diode 41 is connected to the power supply line 52, and the p-type anode high impurity concentration region 8 is connected to the input/output signal line 43.

When a positive electrostatic charge flows through the power supply terminal 51 into the electrostatic discharge protection circuit of FIG. 18, a reverse voltage is applied to the PN junction in the protection diode 41, whereby a breakdown current flows through the protection diode 41. When the breakdown current flows through the protection diode 41, the anode terminal 36 is brought to a high voltage by the well resistor 46. Then, the electrostatic discharge protection device 39 is turned ON as the anode terminal 36 is brought to a high voltage by the well resistor 46, so as to create a low-resistance bypass between the power supply line 52 and the input/output signal line 43. Thus, the electrostatic charge entering through the power supply terminal 51 can be bypassed to the input/output signal line 43 through the electrostatic discharge protection device 39.

When a positive electrostatic charge flows into the circuit through the input/output terminal 42, the protection diode 41 is biased in the forward direction. Therefore, the positive electrostatic charge entering through the input/output terminal 42 can be bypassed to the power supply line 52.

Figure 19:
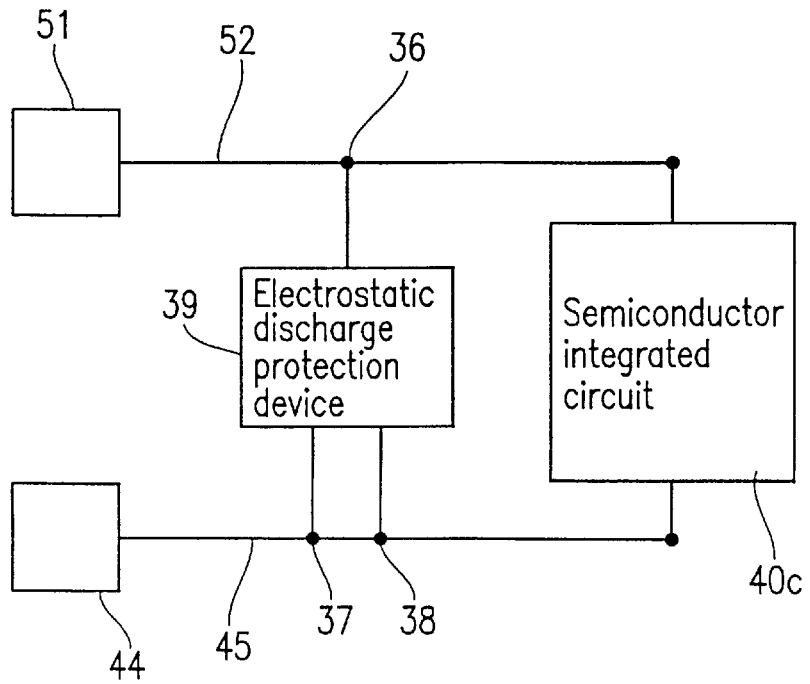
FIG. 19 is a schematic diagram illustrating still another example of an electrostatic discharge protection circuit according to an example of the present invention.

FIG. 19 is a schematic diagram illustrating another example of an electrostatic discharge protection circuit provided between the voltage supply line and the reference voltage line using the electrostatic discharge protection device according to an example of the present invention.

The anode terminal 36 of the electrostatic discharge protection device is connected to the power supply line 52, and the cathode terminal 37 and the cathode gate terminal 38 are connected to the reference voltage line 45. A semiconductor integrated circuit 40c to be electrostatically protected is connected between the power supply line 52 and the reference voltage line 45.

When a positive electrostatic charge flows through the power supply terminal 51 into the electrostatic discharge protection circuit of FIG. 19, a reverse voltage is applied to the trigger diode of the electrostatic discharge protection device 39, thereby turning ON the electrostatic discharge protection device 39 while forming a low-resistance bypass between the power supply line 52 and the reference voltage line 45. Thus, the positive electrostatic charge entering through the power supply terminal 51 can be bypassed to the reference voltage line 45 through the electrostatic discharge protection device 39.

When a positive electrostatic charge flows into the circuit through the reference voltage terminal 44, the diode in the electrostatic discharge protection device 39 (including the p-type cathode gate high impurity concentration region 7, the p-type substrate 1, the n-type well 2, and the n-type anode gate high impurity concentration region 5 (FIG. 1)) is biased in the forward direction. Therefore, the positive electrostatic charge entering through the reference voltage terminal 44 can be bypassed to the power supply line 52 and to the power supply terminal 51.

Figure 20:
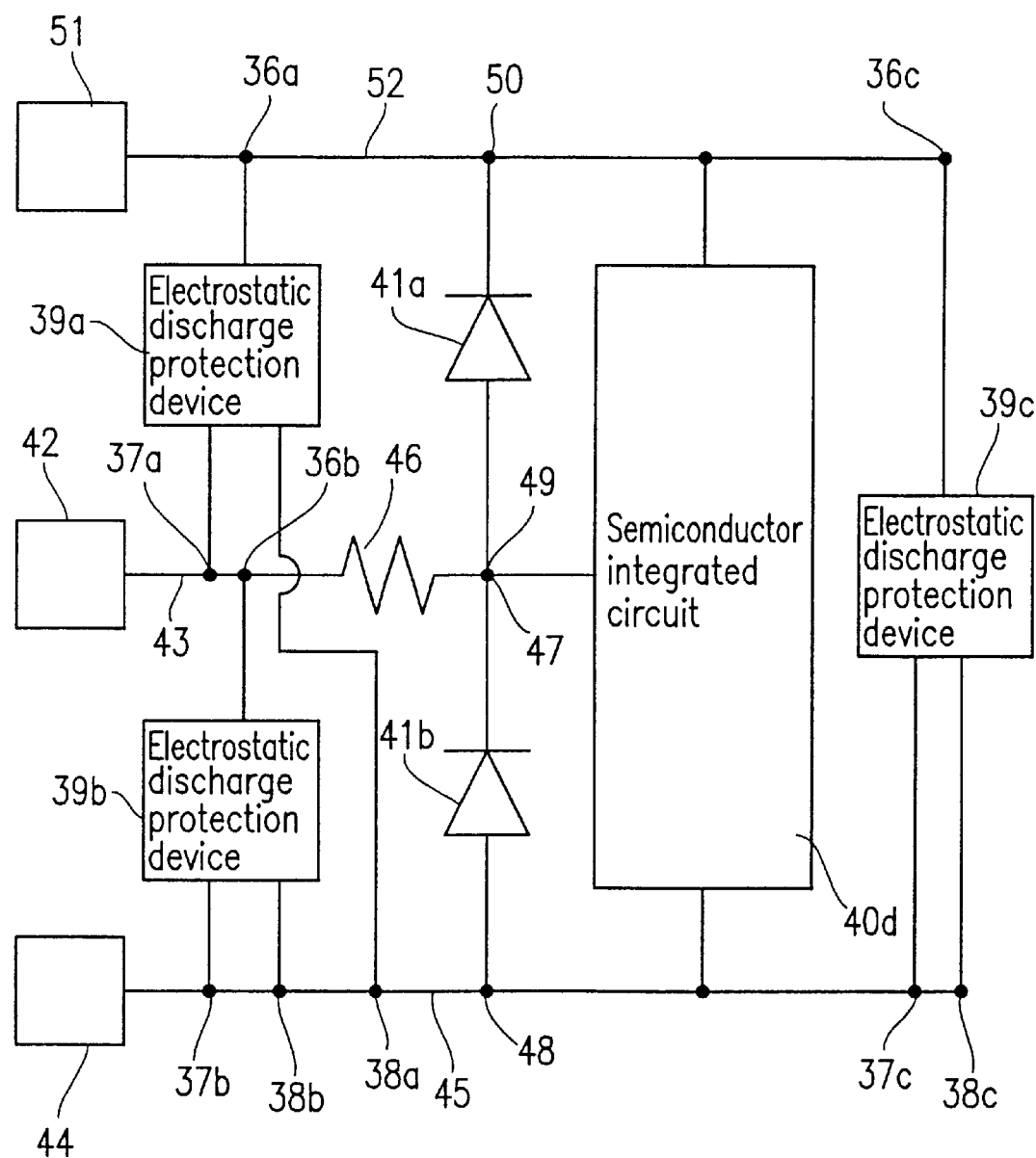
FIG. 20 is a schematic diagram illustrating an electrostatic discharge protection circuit according to an example of the present invention.

FIG. 20 is a schematic diagram illustrating an electrostatic discharge protection circuit including the electrostatic discharge protection device as described above according to an example of the present invention, which is capable of bypassing an electrostatic charge entering the semiconductor integrated circuit through any of an input/output terminal, a power supply terminal, and a reference voltage terminal, to another of the input/output terminal, the power supply terminal, and the reference voltage terminal.

The electrostatic discharge protection circuit comprises electrostatic discharge protection devices 39a, 39b and 39c according to the present invention, protection diodes 41a and 41b, and a well resistor 46. An anode terminal 36a of the electrostatic discharge protection device 39a is connected to the power supply line 52, a cathode terminal 37a thereof to the input/output signal line 43, and a cathode gate terminal 38a thereof to the reference voltage line 45. An anode terminal 36b of the electrostatic discharge protection device 39b is connected to the input/output signal line 43, a cathode terminal 37b and a cathode gate terminal 38b thereof to the reference voltage line 45. An anode terminal 36c of the electrostatic discharge protection device 39c is connected to the power supply line 52, and a cathode terminal 37c and a cathode gate terminal 38c to the reference voltage line 45. A semiconductor integrated circuit 40d to be electrostatically protected is connected between the power supply line 52 and the reference voltage line 45.

The protection diodes 41a and 41b are provided in the step of producing the electrostatic discharge protection devices 39a, 39b and 39c. The protection diode 41a includes the p-type anode high impurity concentration region 8 and the n-type cathode high impurity concentration region 9. An example of this is the protection diode formed in the n-type well 2 on the p-type substrate 1 as illustrated in FIG. 17. The p-type anode high impurity concentration region 8 of the protection diode 41a is connected to the input/output signal line 43, and the n-type cathode high impurity concentration region 9 thereof is connected to the power supply line 52. The protection diode 41b includes the p-type anode high impurity concentration region 8 and the n-type cathode high impurity concentration region 9. An example of such a diode is the protection diode formed on the p-type substrate 1 illustrated in FIG. 16. The p-type anode high impurity concentration region 8 of the protection diode 41b is connected to the reference voltage line 45, and the n-type cathode high impurity concentration region 9 is connected to the input/output signal line 43.

When a positive electrostatic charge flows through the power supply terminal 51 into the electrostatic discharge protection circuit of FIG. 20 and the input/output terminal 42 is grounded, a reverse voltage is applied across the PN junction of the protection diode 41a, whereby a reverse current flows through the diode 41a. Then, the anode terminal 36a is brought to a higher voltage than the cathode terminal 37a by the well resistor 46, thereby turning ON the electrostatic discharge protection device 39a while forming a low-resistance bypass between the power supply line 52 and the input/output signal line 43. Thus, the electrostatic charge entering through the power supply line 52 can be bypassed to the input/output signal line 43 through the electrostatic discharge protection device 39a.

When a positive electrostatic charge flows into the circuit through the input/output signal line 43 and the power supply terminal 51 is grounded, the protection diode 41a is biased in the forward direction. Therefore, the positive electrostatic charge entering through the input/output terminal 42 can be bypassed to the power supply line 52.

When a positive electrostatic charge flows into the circuit through the input/output terminal 42 and the reference voltage terminal 44 is grounded, a reverse voltage is applied across the PN junction of the protection diode 41b, and the protection diode 41a is biased in the forward direction, whereby a current flows through the protection diode 41a or 41b. Then, the anode terminal 36b is brought to a higher voltage than the cathode terminal 37b by the well resistor 46, thereby turning ON the electrostatic discharge protection device 39b while forming a low-resistance bypass between the input/output signal line 43 and the reference voltage line 45. Thus, the electrostatic charge entering through the input/output terminal 42 can be bypassed to the reference voltage line 45 through the electrostatic discharge protection device 39b.

When a positive electrostatic charge flows into the circuit through the reference voltage terminal 44 and the input/output terminal 42 is grounded, the diode in the electrostatic discharge protection device 39b (including the p-type cathode gate high impurity concentration region 7, the p-type substrate 1, the n-type well 2, and the n-type anode gate high impurity concentration region 5 (FIG. 1)) is biased in the forward direction, while the protection diode 41b is also biased in the forward direction. Therefore, the positive electrostatic charge entering through the reference voltage terminal 44 can be bypassed to the input/output signal line 43 through the low-resistance bypass.

When a positive electrostatic charge flows into the circuit through the power supply terminal 51 and the reference voltage terminal is grounded, the power supply line 52 is brought to a higher voltage than the reference voltage line 45, thereby turning ON the electrostatic discharge protection device 39c while forming a low-resistance bypass between the power supply line 52 and the reference voltage line 45. Thus, the electrostatic charge entering through the power supply terminal 51 can be bypassed to the reference voltage line 45 through the electrostatic discharge protection device 39c.

When a positive electrostatic charge flows into the circuit through the reference voltage terminal 44 and the power supply terminal 51 is grounded, the diode in the electrostatic discharge protection device 39c (including the p-type cathode gate high impurity concentration region 7, the p-type substrate 1, the n-type well 2, and the n-type anode gate high impurity concentration region 5 (FIG. 1)) is biased in the forward direction, while the protection diodes 41a and 41b are connected in series in the forward direction. Therefore, the positive electrostatic charge entering through the reference voltage terminal 44 can be bypassed to the power supply line 52 and the power supply terminal 51 through the low-resistance bypass.

Figure 21:
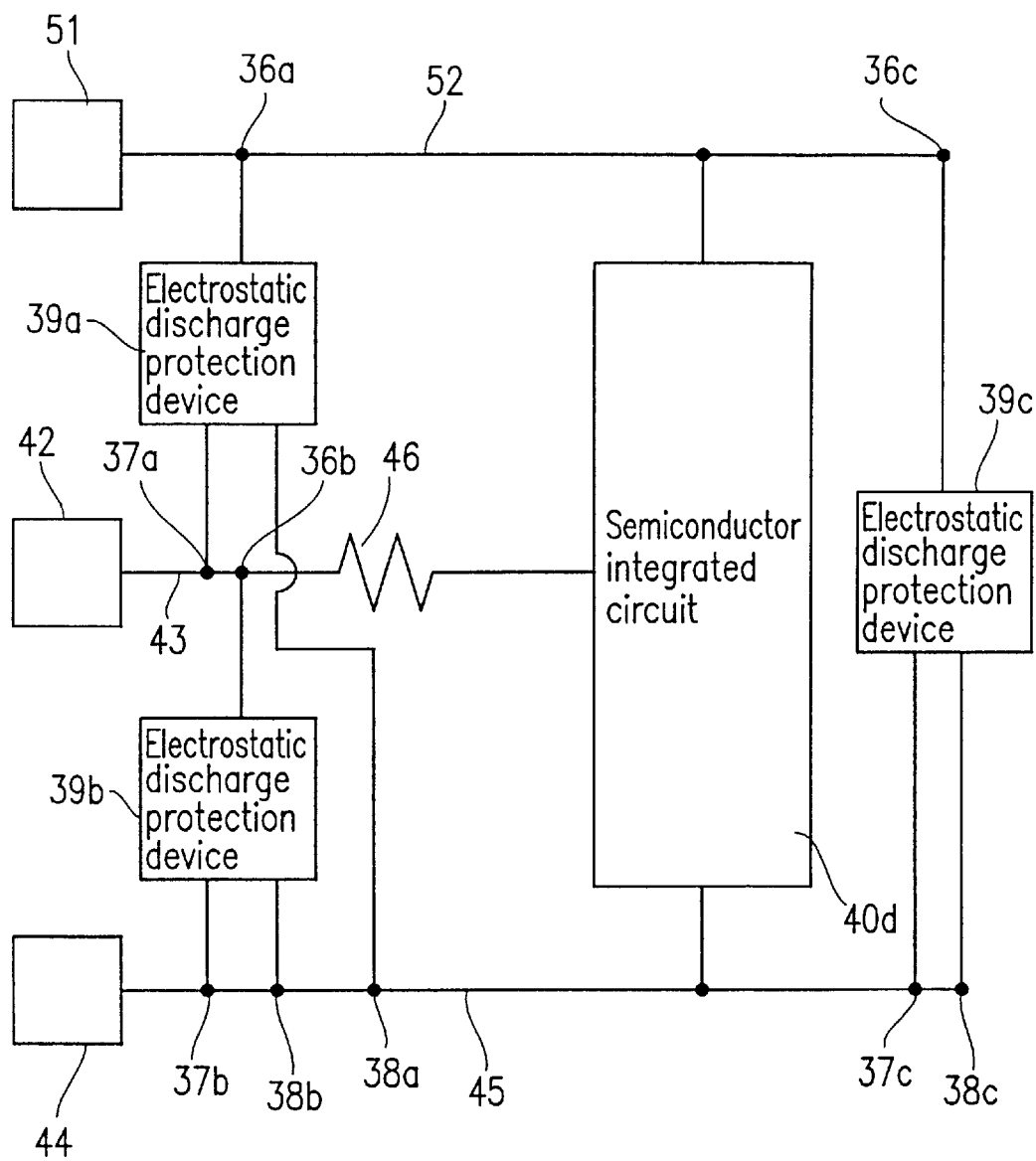
FIG. 21 is a schematic diagram illustrating an electrostatic discharge protection circuit according to an example of the present invention.

FIG. 21 is a schematic diagram illustrating an electrostatic discharge protection circuit including the electrostatic discharge protection device as described above according to another example of the present invention, which is capable of bypassing an electrostatic charge entering the semiconductor integrated circuit through any of an input/output terminal, a power supply terminal, and a reference voltage terminal, to another of the input/output terminal, the power supply terminal, and the reference voltage terminal.

The electrostatic discharge protection circuit of FIG. 21 is obtained by eliminating the protection diodes 41a and 41b from the electrostatic discharge protection circuit of FIG. 20. When a positive electrostatic charge flows into the circuit, in which the protection diodes 41a and 41b are eliminated, through the input/output terminal 42, a voltage equal to or greater than the breakdown voltage between the protection diodes 41a and 41b may be applied to the semiconductor integrated circuit 40d. However, if the semiconductor integrated circuit 40d is not broken by an applied voltage which is as high as the turn-on voltage of the electrostatic discharge protection devices 39a or 39b, the electrostatic discharge protection circuit of FIG. 21 may be employed to implement an electrostatic discharge protection circuit capable of bypassing an electrostatic charge entering through any of an input/output terminal, a power supply terminal, and a reference voltage terminal, to another of the input/output terminal, the power supply terminal, and the reference voltage terminal, as will be described in more detail below.

A positive electrostatic charge entering the circuit of FIG. 21 through the input/output terminal 42 can be bypassed to the power supply terminal 51 through a low-resistance electrostatic charge bypass, which extends from the input/output terminal 42, via the input/output signal line 43, the electrostatic discharge protection device 39b, the reference voltage line 45, the forward diode of the electrostatic discharge protection device 39c (including the p-type cathode gate high impurity concentration region 7, the p-type substrate 1, the n-type well 2, and the n-type anode gate high impurity concentration region 5 (FIG. 1)), the power supply line 52, and then to power supply terminal 51.

A positive electrostatic charge entering the circuit of FIG. 21 through the input/output terminal 42 can be bypassed to the reference voltage terminal 44 through a low-resistance electrostatic charge bypass, which extends from the input/ output terminal 42, via the input/output signal line 43, the electrostatic discharge protection device 39b, the reference voltage line 45, and then to the reference voltage terminal 44.

A positive electrostatic charge entering the circuit of FIG. 21 through the power supply terminal 51 can be bypassed to the input/output terminal 42 through a low-resistance electrostatic charge bypass, which extends from the power supply terminal 51, via the power supply line 52, the electrostatic discharge protection device 39a, the input/output signal line 43, and then to the input/output terminal 42.

A positive electrostatic charge entering the circuit of FIG. 21 through the power supply terminal 51 can be bypassed to the reference voltage terminal 44 through a low-resistance electrostatic charge bypass, which extends from the power supply terminal 51, via the power supply line 52, the electrostatic discharge protection device 39c, the reference voltage line 45, and then to the reference voltage terminal 44.

A positive electrostatic charge entering the circuit of FIG. 21 through the reference voltage terminal 44 can be bypassed to the input/output terminal 42 through a low-resistance electrostatic charge bypass, which extends from the reference voltage terminal 44, via the forward diode of the electrostatic discharge protection device 39b (including the p-type cathode gate high impurity concentration region 7, the p-type substrate 1, the n-type well 2, and the n-type anode gate high impurity concentration region 5 (FIG. 1)), the input/output signal line 43, and then to the input/output terminal 42.

A positive electrostatic charge entering the circuit of FIG. 21 through the reference voltage terminal 44 can be bypassed to the power supply terminal 51 through a low-resistance electrostatic charge bypass, which extends from the reference voltage terminal 44, via the reference voltage line 45, the forward diode of the electrostatic discharge protection device 39c (including the p-type cathode gate high impurity concentration region 7, the p-type substrate 1, the n-type well 2, and the n-type anode gate high impurity concentration region 5 (FIG. 1)), the power supply line 52, and then to the power supply terminal 51.

If the semiconductor integrated circuit 40d is not broken by an applied voltage which is equal to or greater than the breakdown voltage between the protection diodes 41a and 41b, it is possible, by employing the electrostatic discharge protection circuit of FIG. 21, to eliminate one or more protection diodes, thereby reducing the layout area occupied by the electrostatic discharge protection circuit, and thus reducing the area of the chip on which the semiconductor integrated circuit is to be provided. Therefore, it is possible to increase the number of semiconductor integrated circuit chips to be fabricated on a wafer, thereby providing an effect of reducing the cost of a semiconductor integrated circuit chip. While the well resistor 46 is provided in the above examples for restricting the electrostatic charge flowing into the semiconductor integrated circuit 40d, the well resistor 46 may be eliminated in some cases where the electrostatic resistance of the semiconductor integrated circuit 40d is relatively high.

Figure 22:
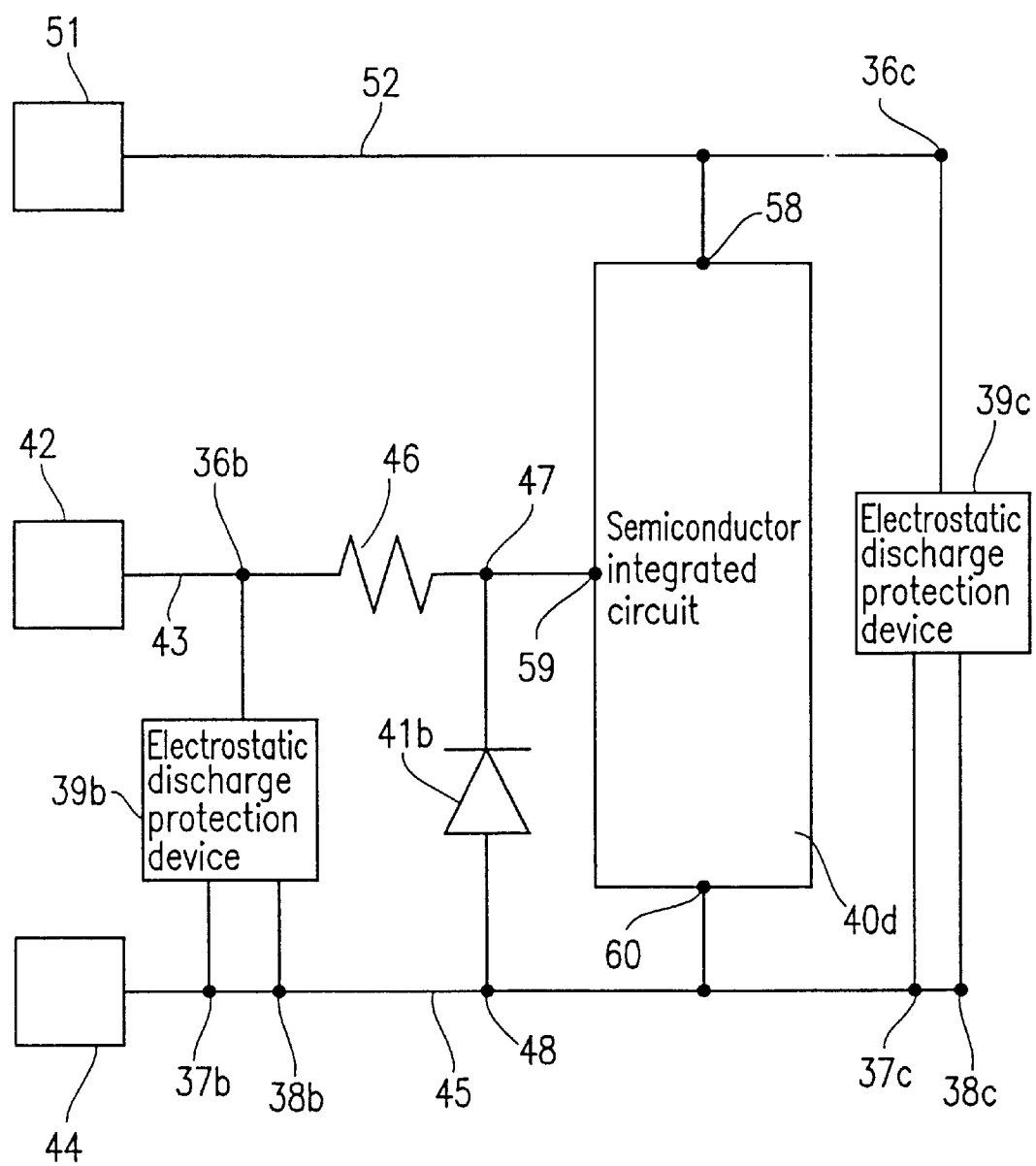
FIG. 22 is a schematic diagram illustrating an electrostatic discharge protection circuit according to an example of the present invention.

FIG. 22 is a schematic diagram illustrating an electrostatic discharge protection circuit including the electrostatic discharge protection device as described above according to another example of the present invention, which is capable of bypassing an electrostatic charge entering the semiconductor integrated circuit through any of an input/output terminal, a power supply terminal, and a reference voltage terminal, to another of the input/output terminal, the power supply terminal, and the reference voltage terminal.

The electrostatic discharge protection circuit of FIG. 22 is obtained by eliminating the electrostatic discharge protection device 39a and the protection diode 41a from the electrostatic discharge protection circuit of FIG. 22.

The electrostatic discharge protection circuit of FIG. 22 may be employed to implement an electrostatic discharge protection circuit capable of bypassing an electrostatic charge entering through any of an input/output terminal, a power supply terminal, and a reference voltage terminal, to another of the input/output terminal, the power supply terminal, and the reference voltage terminal, as will be described in more detail below.

A positive electrostatic charge entering the circuit of FIG. 22 through the input/output terminal 42 can be bypassed to the power supply terminal 51 through a low-resistance electrostatic charge bypass, which extends from the input/output terminal 42, via the input/output signal line 43, the electrostatic discharge protection device 39b, the reference voltage line 45, the forward diode of the electrostatic discharge protection device 39c (including the p-type cathode gate high impurity concentration region 7, the p-type substrate 1, the n-type well 2, and the n-type anode gate high impurity concentration region 5 (FIG. 1)), the power supply line 52, and then to power supply terminal 51.

A positive electrostatic charge entering the circuit of FIG. 22 through the input/output terminal 42 can be bypassed to the reference voltage terminal 44 through a low-resistance electrostatic charge bypass, which extends from the input/output terminal 42, via the input/output signal line 43, the electrostatic discharge protection device 39b, the reference voltage line 45, and then to the reference voltage terminal 44.

A positive electrostatic charge entering the circuit of FIG. 22 through the power supply terminal 51 can be bypassed to the input/output terminal 42 through a low-resistance electrostatic charge bypass, which extends from the power supply terminal 51, via the power supply line 52, the electrostatic discharge protection device 39c, the reference voltage line 45, the protection diode 41b, the forward diode of the electrostatic discharge protection device 39b (including the p-type cathode gate high impurity concentration region 7, the p-type substrate 1, the n-type well 2, and the n-type anode gate high impurity concentration region 5 (FIG. 1)), the input/output signal line 43, and then to the input/output terminal 42.

A positive electrostatic charge entering the circuit of FIG. 22 through the power supply terminal 51 can be bypassed to the reference voltage terminal 44 through a low-resistance electrostatic charge bypass, which extends from the power supply terminal 51, via the power supply line 52, the electrostatic discharge protection device 39c, the reference voltage line 45, and then to the reference voltage terminal 44.

A positive electrostatic charge entering the circuit of FIG. 22 through the reference voltage terminal 44 can be bypassed to the input/output terminal 42 through a low-resistance electrostatic charge bypass, which extends from the reference voltage terminal 44, via the forward diode of the electrostatic discharge protection device 39b (including the p-type cathode gate high impurity concentration region 7, the p-type substrate 1, the n-type well 2, and the n-type anode gate high impurity concentration region 5 (FIG. 1)), the protection diode 41b, the input/output signal line 43, and then to the input/output terminal 42.

A positive electrostatic charge entering the circuit of FIG. 22 through the reference voltage terminal 44 can be bypassed to the power supply terminal 51 through a low-resistance electrostatic charge bypass, which extends from the reference voltage terminal 44, via the reference voltage line 45, the forward diode of the electrostatic discharge protection device 39c (including the p-type cathode gate high impurity concentration region 7, the p-type substrate 1, the n-type well 2, and the n-type anode gate high impurity concentration region 5), the power supply line 52, and then to the power supply terminal 51.

In the electrostatic discharge protection circuit of FIG. 22, as compared to the electrostatic discharge protection circuit of FIG. 22, an excessive voltage which is equal to or greater than the breakdown voltage of the protection diode 41a may be applied for a short period of time to the semiconductor integrated circuit 40d between a contact 58 (between the semiconductor integrated circuit 40d and the power supply line 52) and another contact 59 (between the semiconductor integrated circuit 40d and the input/output signal line 43). However, if the semiconductor integrated circuit 40d has a sufficient resistance against the short-time application of an excessive voltage which is as high as the turn on voltage of the electrostatic discharge protection devices 39b or 39c, the elimination of the electrostatic discharge protection device 39a and the protection diode 41a provides an effect of reducing the layout area occupied by the electrostatic discharge protection circuit, and thus reducing the area of the chip on which the semiconductor integrated circuit is to be provided. Therefore, there is provided an effect of reducing the cost of a semiconductor integrated circuit chip. While the well resistor 46 is provided in the above examples for restricting the electrostatic charge flowing into the semiconductor integrated circuit 40d, the well resistor 46 may be eliminated in some cases where the electrostatic resistance of the semiconductor integrated circuit 40d is relatively high.

Figure 23:
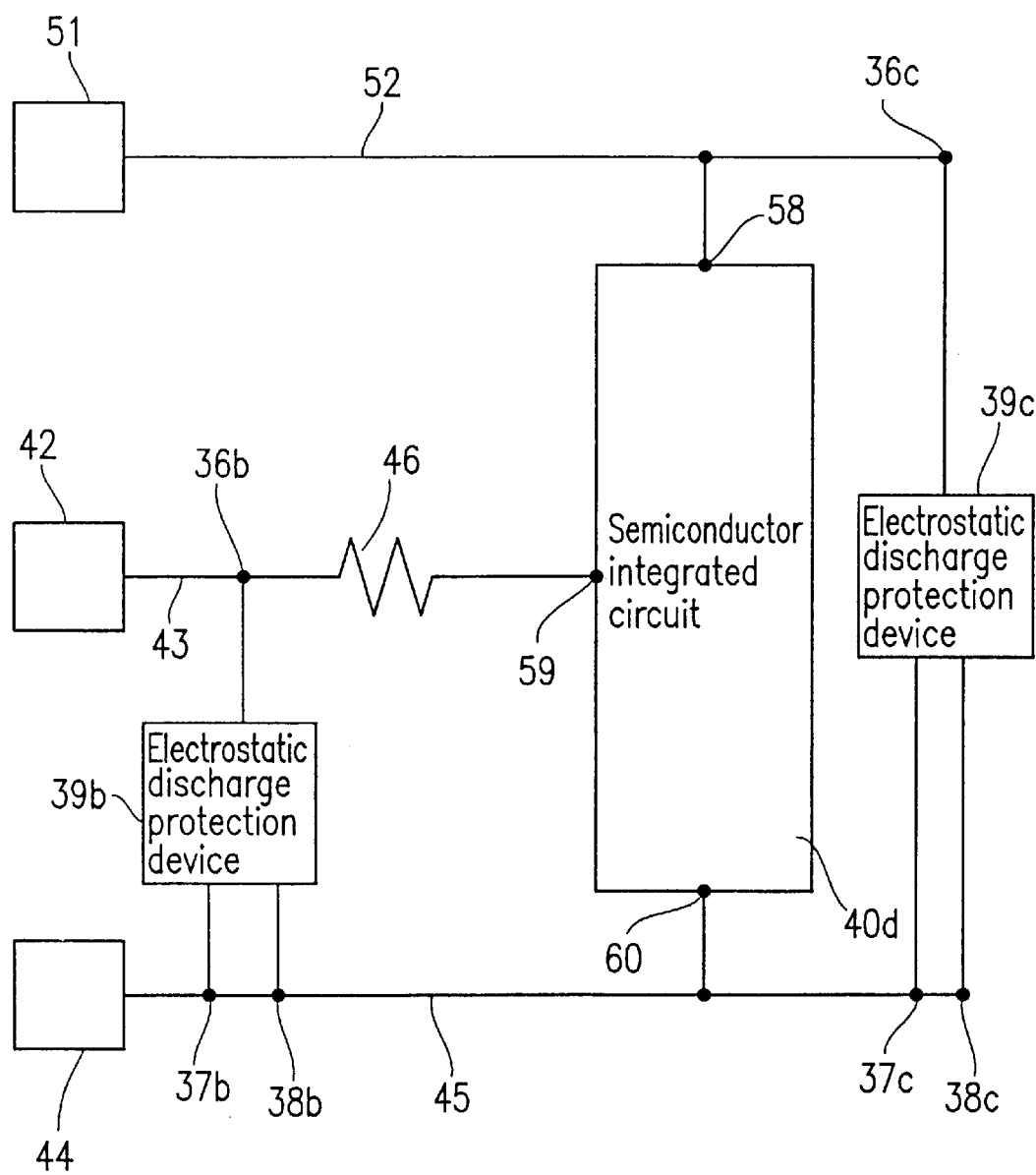
FIG. 23 is a schematic diagram illustrating an electrostatic discharge protection circuit according to an example of the present invention.
Figure 24:
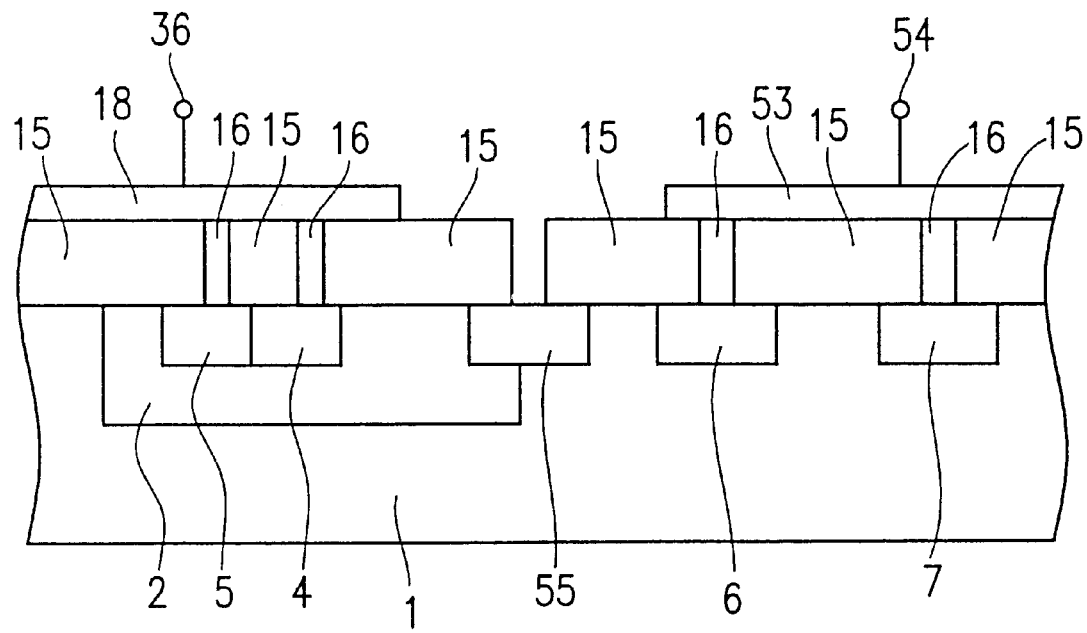
FIG. 24 is a cross-sectional view illustrating a conventional electrostatic discharge protection device.
Figure 25:
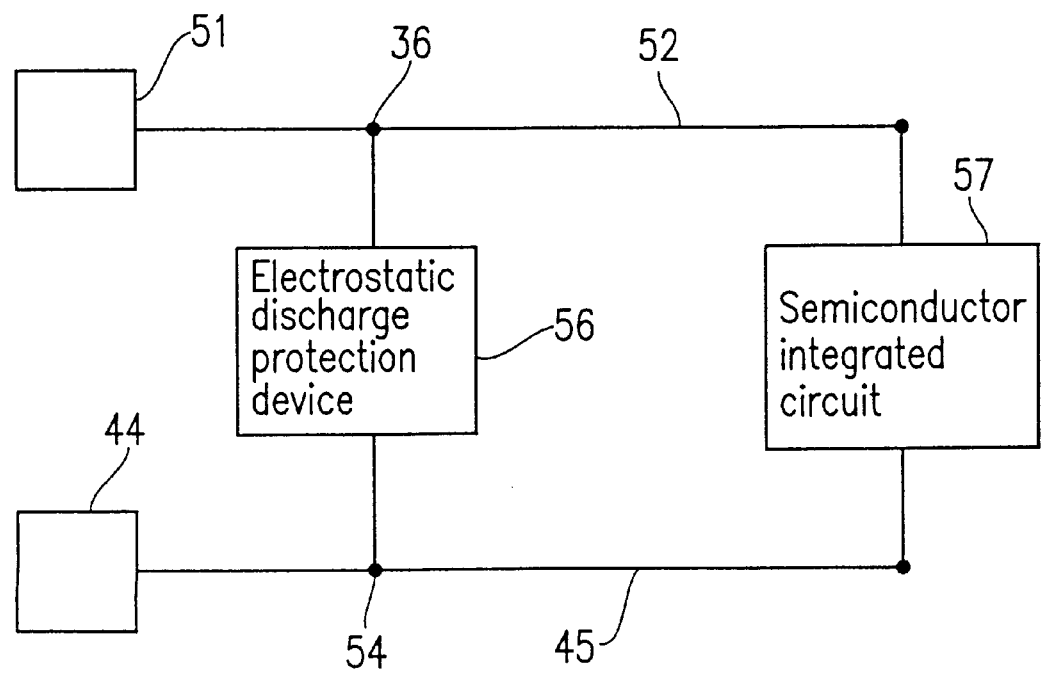
FIG. 25 is a schematic diagram illustrating an electrostatic discharge protection circuit including the conventional electrostatic discharge protection device.

FIG. 23 is a schematic diagram illustrating an electrostatic discharge protection circuit including the electrostatic discharge protection device as described above according to another example of the present invention, which is capable of bypassing an electrostatic charge entering the semiconductor integrated circuit through any of an input/output terminal, a power supply terminal, and a reference voltage terminal, to another of the input/output terminal, the power supply terminal, and the reference voltage terminal.

The electrostatic discharge protection circuit of FIG. 23 is obtained by further eliminating the protection diode 41b from the electrostatic discharge protection circuit of FIG. 22.

A positive electrostatic charge entering the circuit of FIG. 23 through the input/output terminal 42 can be bypassed to the power supply terminal 51 through a low-resistance electrostatic charge bypass, which extends from the input/output terminal 42, via the input/output signal line 43, the electrostatic discharge protection device 39b, the reference voltage line 45, the forward diode of the electrostatic discharge protection device 39c (including the p-type cathode gate high impurity concentration region 7, the p-type substrate 1, the n-type well 2, and the n-type anode gate high impurity concentration region 5 (FIG. 1)), the power supply line 52, and then to power supply terminal 51.

A positive electrostatic charge entering the circuit of FIG. 23 through the input/output terminal 42 can be bypassed to the reference voltage terminal 44 through a low-resistance electrostatic charge bypass, which extends from the input/output terminal 42, via the input/output signal line 43, the electrostatic discharge protection device 39b, the reference voltage line 45, and then to the reference voltage terminal 44.

A positive electrostatic charge entering the circuit of FIG. 23 through the power supply terminal 51 can be bypassed to the input/output terminal 42 through a low-resistance electrostatic charge bypass, which extends from the power supply terminal 51, via the power supply line 52, the electrostatic discharge protection device 39c, the reference voltage line 45, the forward diode of the electrostatic discharge protection device 39b (including the p-type cathode gate high impurity concentration region 7, the p-type substrate 1, the n-type well 2, and the n-type anode gate high impurity concentration region 5 (FIG. 1)), the input/output signal line 43, and then to the input/output terminal 42.

A positive electrostatic charge entering the circuit of FIG. 23 through the power supply terminal 51 can be bypassed to the reference voltage terminal 44 through a low-resistance electrostatic charge bypass, which extends from the power supply terminal 51, via the power supply line 52, the electrostatic discharge protection device 39c, the reference voltage line 45, and then to the reference voltage terminal 44.

A positive electrostatic charge entering the circuit of FIG. 23 through the reference voltage terminal 44 can be bypassed to the input/output terminal 42 through a low-resistance electrostatic charge bypass, which extends from the reference voltage terminal 44, via the forward diode of the electrostatic discharge protection device 39b (including the p-type cathode gate high impurity concentration region 7, the p-type substrate 1, the n-type well 2, and the n-type anode gate high impurity concentration region 5 (FIG. 1)), the input/output signal line 43, and then to the input/output terminal 42.

A positive electrostatic charge entering the circuit of FIG. 23 through the reference voltage terminal 44 can be bypassed to the power supply terminal 51 through a low-resistance electrostatic charge bypass, which extends from the reference voltage terminal 44, via the reference voltage line 45, the forward diode of the electrostatic discharge protection device 39c (including the p-type cathode gate high impurity concentration region 7, the p-type substrate 1, the n-type well 2, and the n-type anode gate high impurity concentration region 5 (FIG. 1)), the power supply line 52, and then to the power supply terminal 51.

In the electrostatic discharge protection circuit of FIG. 23, as compared to the electrostatic discharge protection circuit of FIG. 22, an excessive voltage which is equal to or greater than the breakdown voltage of the protection diode 41b may be applied for a short period of time to the semiconductor integrated circuit 40d between a contact 60 (between the semiconductor integrated circuit 40d and the reference voltage line 45) and the contact 59 (between the semiconductor integrated circuit 40d and the input/output signal line 43). However, if the semiconductor integrated circuit 40d has a sufficient resistance against the short-time application of an excessive voltage which is as high as the turn-on voltage of the electrostatic discharge protection devices 39b, the elimination of the protection diode 41b of FIG. 22 provides an effect of reducing the layout area occupied by the electrostatic discharge protection circuit, and thus reduces the area of the chip on which the semiconductor integrated circuit is to be provided. Therefore, there is provided an effect of reducing the cost of a semiconductor integrated circuit chip. While the well resistor 46 is provided in the above examples for restricting the electrostatic charge flowing into the semiconductor integrated circuit 40d, the well resistor 46 may be eliminated in some cases where the electrostatic resistance of the semiconductor integrated circuit 40d is relatively high.

With the thyristor structure including the trigger diode of the present invention, it is possible to provide an electrostatic discharge protection device which can be turned ON by a low voltage less than or equal to the breakdown voltage between an n-type well and a p-type substrate (or a p-type well), or the breakdown voltage between a p-type well and an n-type substrate (or an n-type well). Thus, it is possible to obtain an electrostatic discharge protection device which can desirably prevent breaking of the semiconductor integrated circuit due to the electrostatic discharge phenomenon. Even when a salicide step is employed in the production of the semiconductor integrated circuit, the p-type high impurity concentration region and the n-type high impurity concentration region of the trigger diode can be insulated from each other. Therefore, it is possible to prevent the anode and the cathode of the thyristor from being electrically shortcircuitted with each other and thereby hampering the normal operation of the semiconductor integrated circuit.

Moreover, when the layout of a p-type or n-type high concentration ion implantation mask according to the present invention is employed in the production of a trigger diode or a protection diode, it is possible to prevent the cathode and the anode of the diode from being electrically shortcircuitted with each other and thereby producing a leak current in the semiconductor integrated circuit, which may otherwise occur when a salicide step is employed in the process of producing a semiconductor integrated circuit.

With the method of producing a trigger diode of a thyristor of the present invention, even in the case where a salicide step is employed in the process of producing a semiconductor integrated circuit, it is possible to produce an electrostatic discharge protection device without adding a further step or photomask to the production process or increasing the production cost of the semiconductor integrated circuit.

With an electrostatic discharge protection circuit including the electrostatic discharge protection device of the present invention, it is possible to provide an electrostatic bypass between a power supply line and an input/output signal line, between a reference voltage line and an input/output signal line, or between a power supply line and a reference voltage line. Thus, it is possible to prevent a semiconductor integrated circuit, which is connected between the power supply line and the input/output signal line, between the reference voltage line and the input/output signal line, or between the power supply line and the reference voltage line, from breaking due to the electrostatic discharge phenomenon.

In the electrostatic discharge protection circuit including the electrostatic discharge protection device of the present invention, one or more of the electrostatic discharge protection devices forming the electrostatic discharge protection circuit and/or one or more of the protection diodes may be eliminated depending upon the electrostatic breakdown resistance of the semiconductor integrated circuit against an electrostatic charge flowing into/out of the circuit and/or depending upon the desired electrostatic breakdown resistance. Thus, it is possible to reduce the layout area on a chip, on which a semiconductor integrated circuit is mounted, to be occupied by the electrostatic discharge protection circuit, and thereby to reduce the chip size. Therefore, it is possible to increase the number of chips to be mounted on a wafer, thereby providing an effect of reducing the production cost per chip.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An electrostatic discharge protection device which is provided at an input or an output of a semiconductor integrated circuit for protecting an internal circuit of the semiconductor integrated circuit from an electrostatic surge flowing into or out of the semiconductor integrated circuit, the electrostatic discharge protection device comprising:

a thyristor; and a trigger diode for triggering the thyristor with a low voltage, wherein the trigger diode comprises:
an n-type cathode high impurity concentration region;
a p-type anode high impurity concentration region; and
an insulator section for electrically insulating a silicide layer formed on a surface of the n-type cathode high impurity concentration region from another silicide layer formed on a surface of the p-type anode high impurity concentration region.

2. An electrostatic discharge protection device according to claim 1, wherein the insulator section comprises:

a gate oxide film formed between the n-type cathode high impurity concentration region and the p-type anode high impurity concentration region for providing a gate of a MOS transistor of the semiconductor integrated circuit;

a polysilicon patterned on the gate oxide film; and a gate sidewall insulator provided on a sidewall of the gate oxide film and a sidewall of the polysilicon for electrically insulating the silicide layer formed on the surface of the n-type cathode high impurity concentration region from the silicide layer formed on the surface of the p-type anode high impurity concentration region.

3. An electrostatic discharge protection device according to claim 1, wherein the insulator section comprises a device separation insulator which is formed between the n-type cathode high impurity concentration region and the p-type anode high impurity concentration region for providing a device separation region of a MOS transistor of the semiconductor integrated circuit.

4. An electrostatic discharge protection device according to claim 3, wherein:

the electrostatic discharge protection device is formed in a p-type semiconductor substrate;

the n-type cathode high impurity concentration region is formed in an n-type well;

a portion of the p-type anode high impurity concentration region is included in the n-type well; and another portion of the p-type anode high impurity concentration region is included in the p-type semiconductor substrate or a p-type well.

5. An electrostatic discharge protection device according to claim 3, wherein:

the electrostatic discharge protection device is formed in a p-type semiconductor substrate;

the p-type anode high impurity concentration region is formed in the p-type semiconductor substrate or a p-type well;

a portion of the n-type cathode high impurity concentration region is included in an n-type well; and another portion of the n-type cathode high impurity concentration region is included in the p-type semiconductor substrate or the p-type well.

6. An electrostatic discharge protection device according to claim 3, wherein:

the electrostatic discharge protection device is formed in an n-type semiconductor substrate;

the n-type cathode high impurity concentration region is formed in the n-type semiconductor substrate;

a portion of the p-type anode high impurity concentration region is included in a p-type well; and another portion of the p-type anode high impurity concentration region is included in the n-type semiconductor substrate or an n-type well.

7. An electrostatic discharge protection device according to claim 3, wherein:

the electrostatic discharge protection device is formed in an n-type semiconductor substrate;

the p-type anode high impurity concentration region is formed in a p-type well;

a portion of the n-type cathode high impurity concentration region is included in the p-type well; and another portion of the n-type cathode high impurity concentration region is included in the n-type semiconductor substrate or an n-type well.

8. An electrostatic discharge protection device according to claim 1, wherein:

the electrostatic discharge protection device is formed in a p-type semiconductor substrate;

the n-type cathode high impurity concentration region is formed in an n-type well;

a portion of the p-type anode high impurity concentration region is included in the n-type well; and another portion of the p-type anode high impurity concentration region is included in the p-type semiconductor substrate or a p-type well.

9. An electrostatic discharge protection device according to claim 1, wherein:

the electrostatic discharge protection device is formed in a p-type semiconductor substrate;

the p-type anode high impurity concentration region is formed in the p-type semiconductor substrate or a p-type well;

a portion of the n-type cathode high impurity concentration region is included in an n-type well; and another portion of the n-type cathode high impurity concentration region is included in the p-type semiconductor substrate or the p-type well.

10. An electrostatic discharge protection device according to claim 1, wherein:

the electrostatic discharge protection device is formed in an n-type semiconductor substrate;

the n-type cathode high impurity concentration region is formed in the n-type semiconductor substrate;

a portion of the p-type anode high impurity concentration region is included in a p-type well; and another portion of the p-type anode high impurity concentration region is included in the n-type semiconductor substrate or an n-type well.

11. An electrostatic discharge protection device according to claim 1, wherein:

the electrostatic discharge protection device is formed in an n-type semiconductor substrate;

the p-type anode high impurity concentration region is formed in a p-type well;

a portion of the n-type cathode high impurity concentration region is included in the p-type well; and another portion of the n-type cathode high impurity concentration region is included in the n-type semiconductor substrate or an n-type well.

12. The device of claim 1, wherein said insulator section comprises a sidewall located on a gate of the diode and also located on a gate insulating layer of the diode.

* * * * *